United States Patent
Dassanayake et al.

(10) Patent No.: US 12,202,345 B1
(45) Date of Patent: Jan. 21, 2025

(54) DISPLAY WITH PHOTON RECYCLING CAVITY

(71) Applicant: eLUMIGEN, LLC, Troy, MI (US)

(72) Inventors: Mahendra Dassanayake, Bloomfield Hills, MI (US); Brian Petku, Clarkston, MI (US)

(73) Assignee: eLUMIGEN, LLC, Troy, MI (US)

( * ) Notice: Subject to any disclaimer, the term of this patent is extended or adjusted under 35 U.S.C. 154(b) by 0 days.

(21) Appl. No.: 18/679,560

(22) Filed: May 31, 2024

Related U.S. Application Data

(60) Provisional application No. 63/613,293, filed on Dec. 21, 2023.

(51) Int. Cl.
*B60K 35/22* (2024.01)

(52) U.S. Cl.
CPC ........ *B60K 35/22* (2024.01); *B60K 2360/332* (2024.01); *B60K 2360/42* (2024.01); *B60K 2360/691* (2024.01); *B60K 2360/797* (2024.01)

(58) Field of Classification Search
None
See application file for complete search history.

(56) References Cited

U.S. PATENT DOCUMENTS

| | | | |
|---|---|---|---|
| 4,556,932 A | 12/1985 | Lehrer et al. | |
| 6,677,065 B2 | 1/2004 | Blauer | |
| 8,258,704 B2 | 9/2012 | Brant | |
| 8,816,586 B2 | 8/2014 | Marcove et al. | |
| 8,922,655 B2 | 12/2014 | Forgue | |
| 9,050,937 B2 | 6/2015 | Gong et al. | |
| 9,067,556 B2 | 6/2015 | Bosch et al. | |
| 9,290,123 B2 | 3/2016 | Salter et al. | |
| 9,656,598 B1 | 5/2017 | Salter et al. | |
| 9,776,558 B2 | 10/2017 | Piersing et al. | |
| 9,855,797 B1 | 1/2018 | Salter et al. | |
| 9,903,999 B2 | 2/2018 | Iordache et al. | |
| 9,987,973 B2 | 6/2018 | Elwell et al. | |
| 10,011,215 B2 | 7/2018 | Roberts et al. | |
| 10,064,259 B2 | 8/2018 | Buttolo et al. | |
| 10,081,295 B2 | 9/2018 | Dellock et al. | |
| 10,112,531 B2 | 10/2018 | Buttolo et al. | |
| 10,118,568 B2 | 11/2018 | Salter et al. | |
| 10,144,365 B2 | 12/2018 | Lobo et al. | |

(Continued)

FOREIGN PATENT DOCUMENTS

| | | |
|---|---|---|
| CN | 105522981 A | 4/2016 |
| CN | 111192949 A | 5/2020 |

(Continued)

*Primary Examiner* — Christopher Braniff
(74) *Attorney, Agent, or Firm* — Harness, Dickey & Pierce, P.L.C.

(57) ABSTRACT

A display includes a first housing portion having graphic openings therein, a second housing portion spaced apart from the first housing portion and a first circuit board having a plurality of light emitting diodes. The first circuit board is disposed between the first housing portion and the second housing. The first housing portion and the second housing portion form a first photon recycling cavity having the plurality of light emitting diodes disposed therein so that light from the plurality of light emitting diodes is indirectly communicated through the graphic opening after reflecting within the photon cavity.

19 Claims, 32 Drawing Sheets

(56) References Cited

U.S. PATENT DOCUMENTS

| | | | |
|---|---|---|---|
| 10,168,039 B2 | 1/2019 | Dellock et al. | |
| 10,235,911 B2 | 3/2019 | Salter et al. | |
| 10,267,481 B2 | 4/2019 | Salter et al. | |
| 10,299,345 B2 | 5/2019 | Salter et al. | |
| 10,300,837 B2 | 5/2019 | Iwao et al. | |
| 10,351,050 B1 | 7/2019 | Elwell | |
| 10,576,877 B2 | 3/2020 | Moore et al. | |
| 10,598,332 B1 | 3/2020 | Elwell et al. | |
| 10,795,068 B1 | 10/2020 | Dellock et al. | |
| 10,814,801 B2 | 10/2020 | Sanahuja Clot et al. | |
| 10,836,306 B1 | 11/2020 | Dubey et al. | |
| 10,967,799 B2 | 4/2021 | Messenger et al. | |
| 11,040,652 B2 | 6/2021 | Snyder et al. | |
| 11,203,281 B1 | 12/2021 | Johnson et al. | |
| 11,371,688 B1 | 6/2022 | Tian et al. | |
| 11,628,780 B2 | 4/2023 | Kim et al. | |
| 11,885,479 B2 | 1/2024 | Arai et al. | |
| 2011/0148312 A1* | 6/2011 | Zhang | H01L 27/156 257/E33.001 |
| 2012/0057327 A1* | 3/2012 | Le | F21K 9/64 362/311.06 |
| 2012/0144705 A1 | 6/2012 | Pierce et al. | |
| 2014/0036536 A1* | 2/2014 | Gettemy | G02B 26/02 362/613 |
| 2014/0184068 A1 | 7/2014 | Kwon | |
| 2014/0354170 A1 | 12/2014 | Gredler et al. | |
| 2015/0122572 A1 | 5/2015 | Niwa | |
| 2015/0239390 A1 | 8/2015 | Oliverio et al. | |
| 2015/0241016 A1 | 8/2015 | Sura et al. | |
| 2016/0107571 A1 | 4/2016 | Dellock et al. | |
| 2017/0113602 A1 | 4/2017 | Salter et al. | |
| 2018/0322712 A1 | 11/2018 | Salter et al. | |
| 2019/0272779 A1 | 9/2019 | Gamble et al. | |
| 2020/0198535 A1* | 6/2020 | Kontani | B60K 37/20 |
| 2024/0123824 A1* | 4/2024 | Wurster | B60K 35/21 |
| 2024/0206042 A1 | 6/2024 | Bocock et al. | |

FOREIGN PATENT DOCUMENTS

| | | |
|---|---|---|
| DE | 102008010490 A1 | 8/2009 |
| DE | 202017100682 U1 | 2/2017 |
| GB | 2527774 A | 1/2016 |
| JP | 3169564 U | 8/2011 |
| KR | 970000164 A | 1/1997 |
| KR | 101328459 B1 | 11/2013 |
| KR | 102170072 B1 | 10/2020 |
| KR | 102249101 B1 | 5/2021 |
| WO | WO-202093139 A1 | 5/2020 |

* cited by examiner

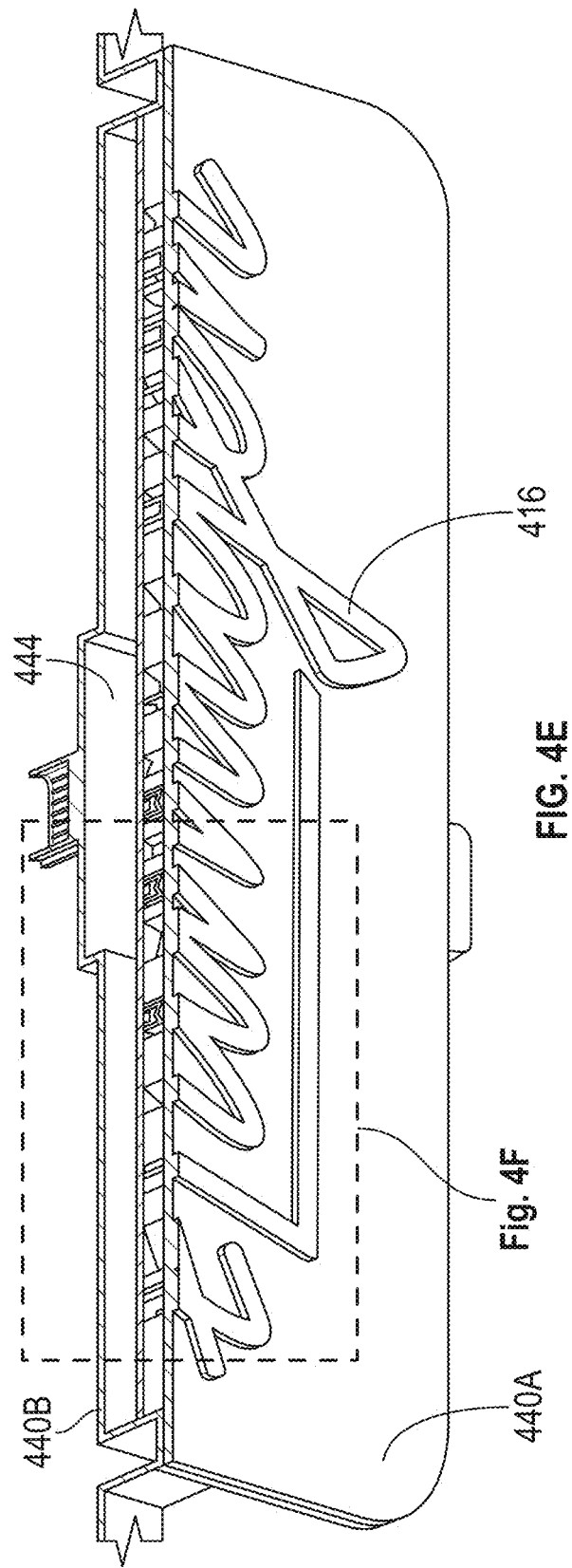
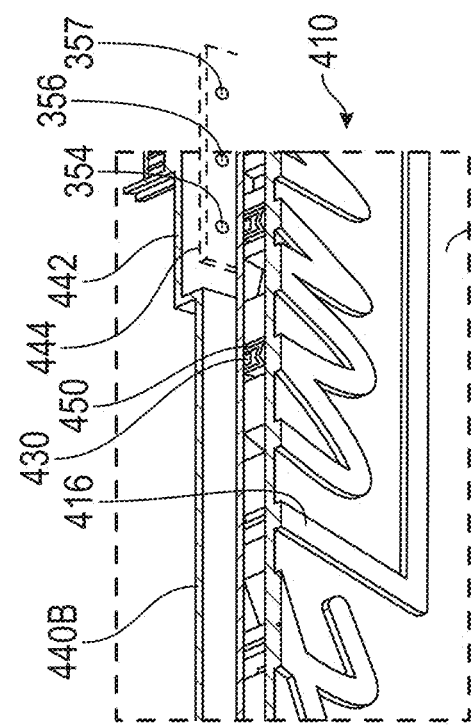
FIG. 4E
FIG. 4F

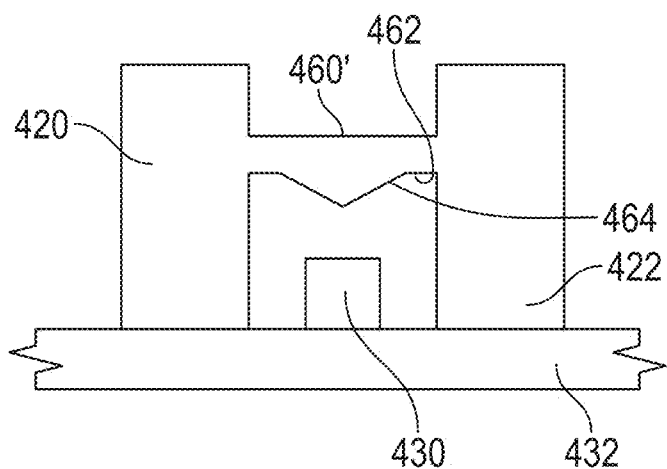
FIG. 4K
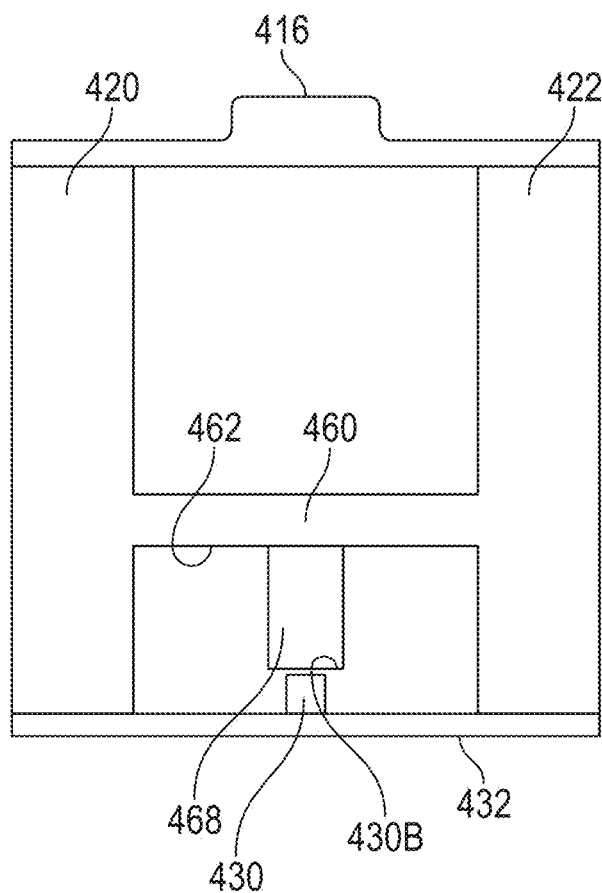 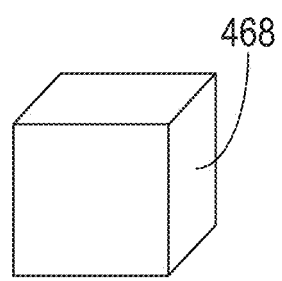
FIG. 4L  FIG. 4M

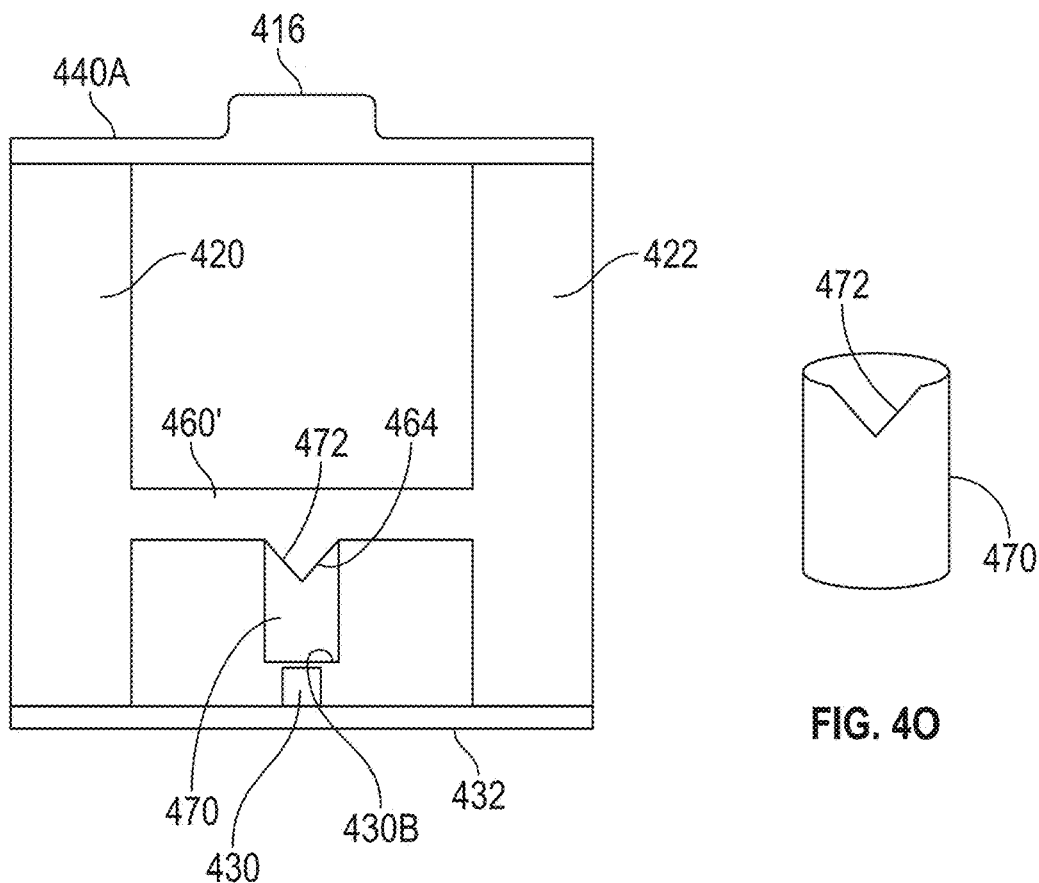
FIG. 4N
FIG. 4O
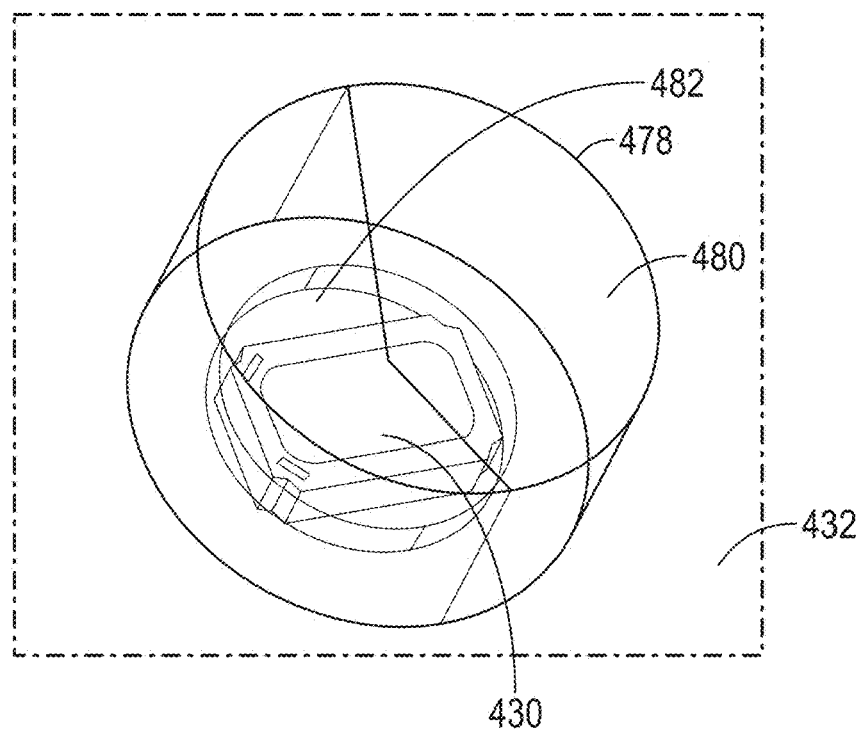
FIG. 4P

| 2LED/SEG 1104 | S01 | S02 | S03 |
|---|---|---|---|
| 1 | 8212.1 | 1368.9 | 32.6 |
| 2 | 593.2 | 6652.5 | 1538.3 |
| 3 | 19.3 | 658.0 | 6715.0 |
| 4 | 3.7 | 17.5 | 330.0 |

# DISPLAY WITH PHOTON RECYCLING CAVITY

CROSS-REFERENCE TO RELATED APPLICATION

This application claims the benefit of U.S. Provisional Application No. 63/613,293, filed on Dec. 21, 2023. The entire disclosure of the above application is incorporated herein by reference.

TECHNICAL FIELD

The present disclosure relates generally to a display using LED light sources and, more specifically, to a display using a photon recycling cavity to allow a uniform distribution of light across the displayed material.

BACKGROUND

This section provides background information related to the present disclosure which is not necessarily prior art.

Backlit commercial billboards, brand signation elements, architectural lighting are highly prevalent in the commercial, industrial, transportation and other applications. Providing uniform distribution in a display provides an aesthetically pleasing product. However, many solutions in the industry provide non-ideal solutions lacking in uniform light output.

SUMMARY

This section provides a general summary of the disclosure and is not a comprehensive disclosure of its full scope or all of its features.

The present disclosure provides addressable illuminated elements at a potentially lower cost approach, to creating messages such as digital signatures of brands, architectural lighting and user experiences via scenario-based user interfaces. Badges on automotive vehicle grills, tailgates, side decoration and other vehicle components and panels may benefit from this application. In one example, the present disclosure uses the interaction of indirect radiation from a non-Lambertian emission with transflective materials enabling direct radiation falling on to it to reflect and transmit off-axis light from a backlight. The present disclosure may be used for dynamic or static commercial displays in industrial, transportation, retail and other sectors. Furthermore, if the backside of the graphic is printed with a light emissive ink such as phosphor-based or dye based, an impactful arrangement may be provided. Additionally, using a segmented OLED as an addressable source behind the transflective front visual graphic could result in extremely thin contoured packages. In another example, Lambertian or non-Lambertian distribution LEDs may be used with optics to redirect the light emitted to fill a chamber whose emissions are indirect.

In one general aspect a display includes a first housing portion having graphic openings therein. The display also includes a second housing portion spaced apart from the first housing portion. The display also includes a first circuit board that may include a plurality of light emitting diodes, said first circuit board disposed between the first housing portion and the second housing. The display also includes said first housing portion and the second housing portion form a first photon recycling cavity having the plurality of light emitting diodes disposed therein so that light from the plurality of light emitting diodes is indirectly communicated through the graphic opening after reflecting within the photon cavity.

Implementations may include one or more of the following features. The display may include a second circuit board electrically coupled to the first circuit board. The second circuit board may include a power supply. The power supply may include a buck power supply. The second circuit board is disposed in a pocket formed in the second housing. The first circuit board is parallel to the second circuit board within the pocket. The plurality of light emitting diodes is misaligned with the graphic openings. The plurality of light emitting diodes is aligned with opaque portions between the graphic openings. A transreflective ink is disposed on the first housing portion. The transreflective ink is between a light source and the graphic opening. The transreflective ink is applied to a film and thermoformed to an inner surface of the first housing portion. The second housing portion may include an outer wall having a white surface. The white surface is formed from white composite material. The plurality of light emitting diodes may include 360 degree side emitting diodes. A vehicle may include: a grill, and the display coupled to the grill. A vehicle may include: a tailgate, and the display coupled to the tailgate. A vehicle may include: a bumper or body panel, the display coupled to the bumper or body panel. A point of sale display unit may include: a panel, and the display coupled to the panel. The panel may include a back panel. The panel may include at least one of a front panel or a side panel.

In another general the display includes a first housing portion having graphic openings therein. The display also includes a second housing portion spaced apart from the first housing portion. The display also includes a first circuit board that may include a plurality of light emitting diodes (LEDs), said first circuit board disposed between the first housing portion and the second housing portion. The display also includes a first side wall and a second side wall spaced apart from the first side wall, said first side wall and the second side wall defining a plurality of photon recycling cavities in a sequence where adjacent photon recycling cavities having a shared end wall, at least one of the plurality of light emitting diodes disposed in each of the plurality of photon recycling cavities, each LED associated with an optical element redirecting light within the associated one of the plurality of photon recycling cavities so that light from the plurality of light emitting diode is indirectly communicated through the graphic opening after reflecting within the photon recycling cavity.

Implementations may include one or more of the following features. The display where the first side wall and the second side wall are reflective. The shared end wall is reflective. The first side wall and the second side wall are molded into a monolithic structure. The monolithic structure is formed of white plastic. The monolithic structure is formed of opaque material. The optical element may include a bridge extending between the first side wall and the second side wall formed in the monolithic structure. A first LED of the plurality of LEDs is disposed between the bridge and the first circuit board. The bridge is opaque. The display may include a coupler disposed between the bridge and a first LED of the plurality of LEDs, said coupler directing light to the bridge, said bridge redirecting the light toward the first side wall and the second side wall. The coupler may include a rectangular solid. The bridge may include a redirection wall formed therein, the redirection wall being disposed to redirect light from the bridge. The redirection wall is formed from a conical surface. The redirection wall is coupled to a coupler disposed between the redirection wall and a first LED of the plurality of LEDs, where the redirection wall of the bridge redirects the light toward the first side wall and the second side wall. The coupler may include a cylindrical solid. The optical element may include a redirection element directing the light from a first LED of the plurality of LEDs toward the first side wall, the second side wall and the shared end wall. The redirection element may include an upper angled surface redirecting the light from the first LED. The redirection element may include an inverted conical upper surface redirecting the light from the first LED. The redirection element is coupled to the first circuit board. The redirection element surrounds the first LED. The redirection element may include an upper surface adjacent to the first LED. The upper surface is parallel to the first circuit board. The upper surface is concave. The upper surface is convex. The redirection element is formed of clear composite. The first side wall and the second side wall are molded into a monolithic structure using a first injection molding process and the redirection element is formed onto the monolithic structure using a second injection molding process for the clear composite. The monolithic structure is formed of white plastic. The display may include a second circuit board electrically coupled to the first circuit board. The second circuit board may include a power supply. The first housing portion has an inner surface and an outer surface, where a transreflective ink is applied on the inner surface. The transreflective ink is between a light source and the graphic opening. A vehicle may include: a grill, and the display coupled to the grill. A vehicle may include: a tailgate, and the display coupled to the tailgate. A vehicle may include: a bumper or body panel, the display coupled to the bumper or body panel. A point of sale display unit may include: a panel, and the display coupled to the panel. The panel may include a back panel. The panel may include at least one of a front panel or a side panel. Implementations of the described techniques may include hardware, a method or process, or computer software on a computer-accessible medium.

One general aspect includes a method of operating a segmented display. The method also includes in a first segment controlling an increase of light output from a first light emitting diode in the first segment according to a first function. The method also includes communicating at least part of the light output from the first segment to a second segment. The method also includes after communicating at least part of the light from the first segment to the second segment, controlling increase of light output from a second light emitting diode in the second segment according to a second function. Other embodiments of this aspect include corresponding computer systems, apparatus, and computer programs recorded on one or more computer storage devices, each configured to perform the actions of the methods.

Implementations may include one or more of the following features. The method where the first function corresponds to the second function. The first function is a gaussian function. The method may include adjusting a current or a duty cycle of the first light emitting diode and the second light emitting diode to generate adjusted light outputs from the first segment and the second segment. Adjusting the current or the duty cycle may include generating a plurality of scale factors for each of the plurality of segments. The method may include determining a minimum brightness for the plurality of segments, determining the plurality of scale factors for each segment so each segment generates the minimum brightness. Implementations of the described techniques may include hardware, a method or process, or computer software on a computer-accessible medium.

One general aspect includes the segmented display system including a first light emitting diode in a first segment. The system also includes a second light emitting diode in a second segment. The system also includes a controller programmed to control an increase of light output from a first light emitting diode in the first segment according to a first function so that at least part of the light output from the first segment is communicated to the second segment, and, after communicate at least part of the light from the first segment to the second segment, increasing of light output from a second light emitting diode in the second segment according to a second function. Other embodiments of this aspect include corresponding computer systems, apparatus, and computer programs recorded on one or more computer storage devices, each configured to perform the actions of the methods.

Implementations may include one or more of the following features. The segmented display system where the first function corresponds to the second function. The first function is a gaussian function. The controller is programmed to adjust a current or the duty cycle of the light emitting diode to generate adjusted light outputs from the first segment and the second segment. The controller is programmed to adjust a current or a duty cycle by generating a plurality of scale factors for each of the plurality of segments. The controller is programmed to determine a minimum brightness for the plurality of segments, and determine the plurality of scale factors for each segment so each segment generates the minimum brightness. Implementations of the described techniques may include hardware, a method or process, or computer software on a computer-accessible medium.

One general aspect includes generating a laser beam at a laser source. The generating also includes coupling the laser beam to optical fibers to form sub-beams. The generating also includes directing the sub-beams simultaneously to the coating through a guide having a guide pattern. The generating also includes removing the first coating corresponding to the guide pattern simultaneously with each of the plurality of sub-beams.

Implementations may include one or more of the following features. The method where coupling the laser beam may include directing the laser beam into the sub-beams though an optic. Directing the sub-laser beams may include directing the sub-laser laser beams to the coating though an optic. Directing the laser beams though the optic may include directing the sub-beam to distribute energy evenly across the optical fiber. Directing the sub-beams simultaneously to the coating through the guide may include directing the sub-beams simultaneously to the coating through the guide pattern of an opaque guide. Directing the sub-beams simultaneously to the coating through the guide may include directing the sub-beams simultaneously to the coating through a metal guide. Removing the coating may include removing a first coating without removing a second coating between the first coating and the substrate. Implementations of the described techniques may include hardware, a method or process, or computer software on a computer-accessible medium.

One general aspect includes a system for removing a first layer from a substrate. The system also includes a laser source generating a laser beam. The system also includes a plurality of optical fibers having a first end receiving a portion of the laser beam to form sub-beams. The system also includes a guide having pattern of openings therethrough. The system also includes said plurality of optical fibers directing the sub-beams to the first layer of the substrate. The system also includes a controller controlling the laser beam to remove the first layer corresponding to the pattern simultaneously. Other embodiments of this aspect include corresponding computer systems, apparatus, and computer programs recorded on one or more computer storage devices, each configured to perform the actions of the methods.

Implementations may include one or more of the following features. The system may include an optic coupling the laser beam into the sub-beams. The system may include an optic directing the sub-laser laser beams to the coating. The optic directs the sub-beam to distribute energy evenly across the optical fiber. The guide is an opaque guide having the pattern therethrough. The guide is a metal guide having the pattern therethrough. Controller is programmed to remove a first coating without removing a second coating between the first coating and the substrate. Implementations of the described techniques may include hardware, a method or process, or computer software on a computer-accessible medium.

A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions. One general aspect includes a display having a housing. The display also includes a substrate may include a graphic portion and an opaque portion. The display also includes a pixelated backlight disposed between the housing and the substrate, said pixelated back light may include plurality of elements. The display also includes a controller selective controlling the plurality of elements to communicate light therethrough. Other embodiments of this aspect include corresponding computer systems, apparatus, and computer programs recorded on one or more computer storage devices, each configured to perform the actions of the methods.

One general aspect includes a display that includes a housing. The display also includes a substrate may include a graphic portion and an opaque portion. The display also includes a backlight disposed between the housing and the substrate. The display also includes a shutter device disposed between the backlight and the substrate, said shutter device may include a plurality of elements. The display also includes a controller selectively controlling the plurality of elements. Other embodiments of this aspect include corresponding computer systems, apparatus, and computer programs recorded on one or more computer storage devices, each configured to perform the actions of the methods.

A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions. One general aspect includes a display. The display also includes a condition sensor coupled to the display generating a condition signal corresponding to a condition; a controller area network communicating the condition signal; a detector circuit generating a detection signal based on the condition sensor signal; and a light controller receiving the detection signal, said controller generating a control signal to control the display in response to the control signal. Other embodiments of this aspect include corresponding computer systems, apparatus, and computer programs recorded on one or more computer storage devices, each configured to perform the actions of the methods.

Implementations may include one or more of the following features. The vehicle where the display is disposed in a front fascia. The front fascia may include a logo display. The front fascia may include a logo display and a plurality of display elements. The front fascia may include a forward facing surface and an upward facing surface, where the forward facing surface may include a first plurality of elements and the upward facing surface may include a second plurality of elements. The forward facing surface may include a logo display. The forward facing surface may include a sensor area. The front fascia may include a forward facing surface may include a logo display, and a plurality of light elements. The front fascia may include a forward facing surface may include a logo display, a plurality of light elements and a sensor area. The display is disposed in a rear fascia. The rear fascia may include a rearward facing surface and an upward facing surface. The rearward facing surface may include a first plurality of elements and the upward facing surface may include a second plurality of elements. The forward facing surface may include a logo display. The forward facing surface may include a sensor area. The rear fascia may include a rearward facing surface may include a plurality of elements. The condition signal may include a proximity signal from a proximity sensor indicating a remote keyless device is within a predetermined distance. The condition signal may include a collision warning signal from a collision warning sensor. The collision warning sensor may include at least two of a camera, a lidar sensor, radar sensor and an ultrasonic sensor. The condition signal may include a charging signal from a charge detector corresponding to coupling to a charger. The condition signal may include a brake signal from a brake actuator. The light controller is disposed in a pocket formed in the rear of the display. The pocket is disposed adjacent to a logo display. The light controller receives the detection signal and operates the logo display and a plurality of light elements in a sequence determined in response to the detection signal. Implementations of the described techniques may include hardware, a method or process, or computer software on a computer-accessible medium.

One general aspect includes a method of operating a display. The method also includes generating a condition signal corresponding to a condition; generating a detection signal based on the condition sensor signal, and generating a control signal to control the display in response to the control signal. Other embodiments of this aspect include corresponding computer systems, apparatus, and computer programs recorded on one or more computer storage devices, each configured to perform the actions of the methods.

A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions. One general aspect includes a display may include. The display also includes a first plurality of light emitting diodes. The display also includes a first light emitting diode (led) driver coupled to the first plurality of light emitting diodes. The display also includes a second plurality of light emitting diodes. The display also includes a second LED driver coupled to the second plurality of light emitting diodes; a power source coupled to the first LED driver and the second LED driver, and a controller selectively controlling the first LED driver to selectively control the first plurality of LEDs using a first control signal and selectively controlling the second LED driver to selectively control the second plurality of LEDs using a second control signal. Other embodiments of this aspect include corresponding computer systems, apparatus, and computer programs recorded on one or more computer storage devices, each configured to perform the actions of the methods.

Implementations may include one or more of the following features. The display may include a first dc to dc converter coupling the power source to the first LED driver, said first LED driver communicating a first bias control signal to the first dc to dc converter. The display may include a second de to dc converter coupling the power source to the second LED driver, said second LED driver communicating a second bias control signal to the second de to dc converter. The display may include a first remote communication interface communicating the second control signal to a second remote communication interface, said second remote communication interface communicating the second control signal to the second LED driver. The power source is a vehicle power source. The power source is a battery. The power source is a battery coupled to a solar panel. First control signal is generated in response to a sensor disposed at the display. Control signal is generated in response to a sensor disposed at the display. The first plurality of LEDs is disposed in a logo display of the display. The first plurality of LEDs is disposed in an aesthetic portion of the display. The second LEDs may include functional LEDs that are disposed in a functional portion of the display. The functional LEDs may include at least one of a high beam, a low beam, a turn signal, a fog light, brake light or a marker light. The method may include coupling a power source to the first LED driver through a first dc to dc converter, communicating a first bias control signal to the first de to dc converter from the first LED driver. The method may include coupling the power source to the second LED driver through a second dc to dc converter, communicating a second bias control signal to the second dc to dc converter from the second LED driver. The method may include communicating the second control signal to a second remote communication interface from the controller said second remote communication interface. Implementations of the described techniques may include hardware, a method or process, or computer software on a computer-accessible medium.

One general aspect includes a method of controlling a display. The method also includes selectively controlling a first LED driver to selectively control a first plurality of LEDs using a first control signal from a controller disposed at the display. The method also includes selectively controlling a second LED driver to selectively control a second plurality of LEDs using a second control signal. Other embodiments of this aspect include corresponding computer systems, apparatus, and computer programs recorded on one or more computer storage devices, each configured to perform the actions of the methods.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected examples and not all possible implementations and are not intended to limit the scope of the present disclosure.

FIG. 4E is a perspective cross sectional view of the display of FIG. 4A.

FIG. 4F is an enlarged cross sectional view of the display of FIG. 4E.

FIG. 4K is an enlarged end view of the redirection element of FIG. 4K.

FIG. 4L Is an end view of another example of a redirection element having a coupler.

FIG. 4M is a perspective view of a coupler.

FIG. 4N is an end view of another example of a redirection element.

FIG. 4O is a perspective view of the coupler of FIG. 4O.

FIG. 4P is a perspective view of another example of redirection element.

Corresponding reference numerals indicate corresponding parts throughout the several views of the drawings.

DETAILED DESCRIPTION

Figure 1A:
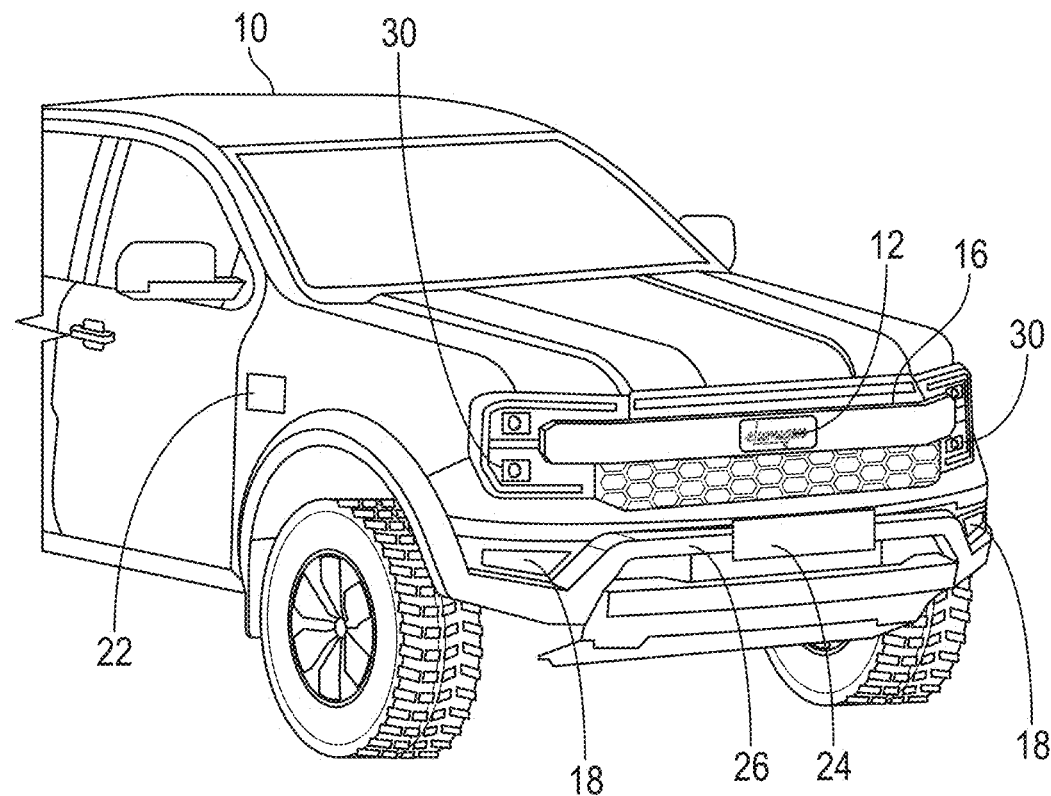
FIG. 1A is a perspective front view of a vehicle having display according to the present disclosure.

The following description is merely exemplary in nature and is not intended to limit the present disclosure, application, or uses. For purposes of clarity, the same reference numbers will be used in the drawings to identify similar elements. As used herein, the phrase "at least one of A, B, and C" should be construed to mean a logical (A or B or C), using a non-exclusive logical OR. It should be understood that steps within a method may be executed in different order without altering the principles of the present disclosure.

Referring now to FIG. 1A, a front and passenger side perspective view of a vehicle 10 is illustrated. The present system provides a display 12 that may be used in various locations of the vehicle 10. The display 12 is illustrated in various locations of the vehicle 10 and may be used for not only vehicle functions but for decorative purposes as well. Different configurations of the display 12 are set forth below. Different display designs may be used in different locations depending on the design requirement. The display 12 may have a common architecture with the final display housing suited for the final use. In the present example, a grill logo 14 is an example of the display 12 affixed to a vehicle grill 16. The grill logo 14 may be provided as original equipment or as an aftermarket product. Likewise, the other locations of the display 12 on a vehicle 10 can be OEM or aftermarket.

In FIG. 1A, the display 12 may include fog or decorative lights 18 that are located on the bumper 26 or lower grill. The display 12 may include decorative lights 20 on the sides of the grill 16, decorative displays 22 on the quarter panel, decorative displays 24 on the front of the bumper may be used. A functional display such as turn signal 30 may also be implemented. It should be noted that the intensity of the light output of the display bay varies depending on the application.

Figure 1B:
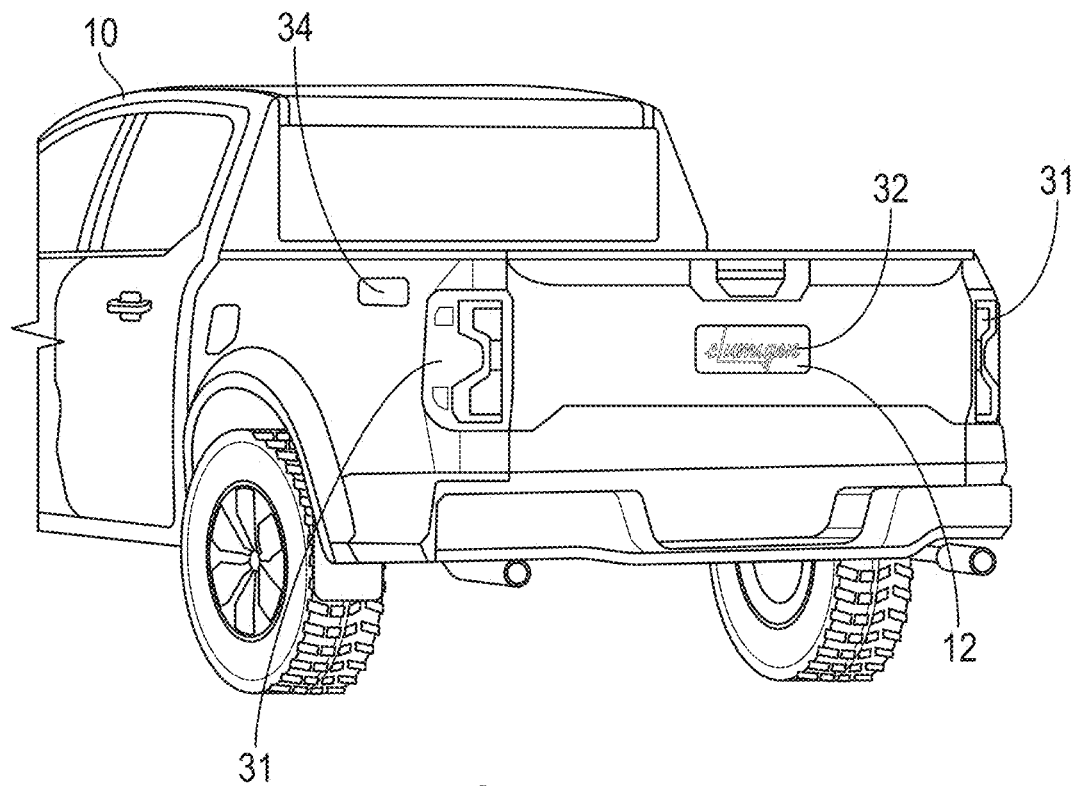
FIG. 1B is a perspective rear view of the vehicle having display according to the present disclosure.

In FIG. 1B, the rear portion of vehicle 10 is set forth. The displays 12 according to the present disclosure may be in various locations including all or a portion of the taillights 31, a tailgate logo display 32, a decorative display 34 on the side of the vehicle 10.

Figure 1C:
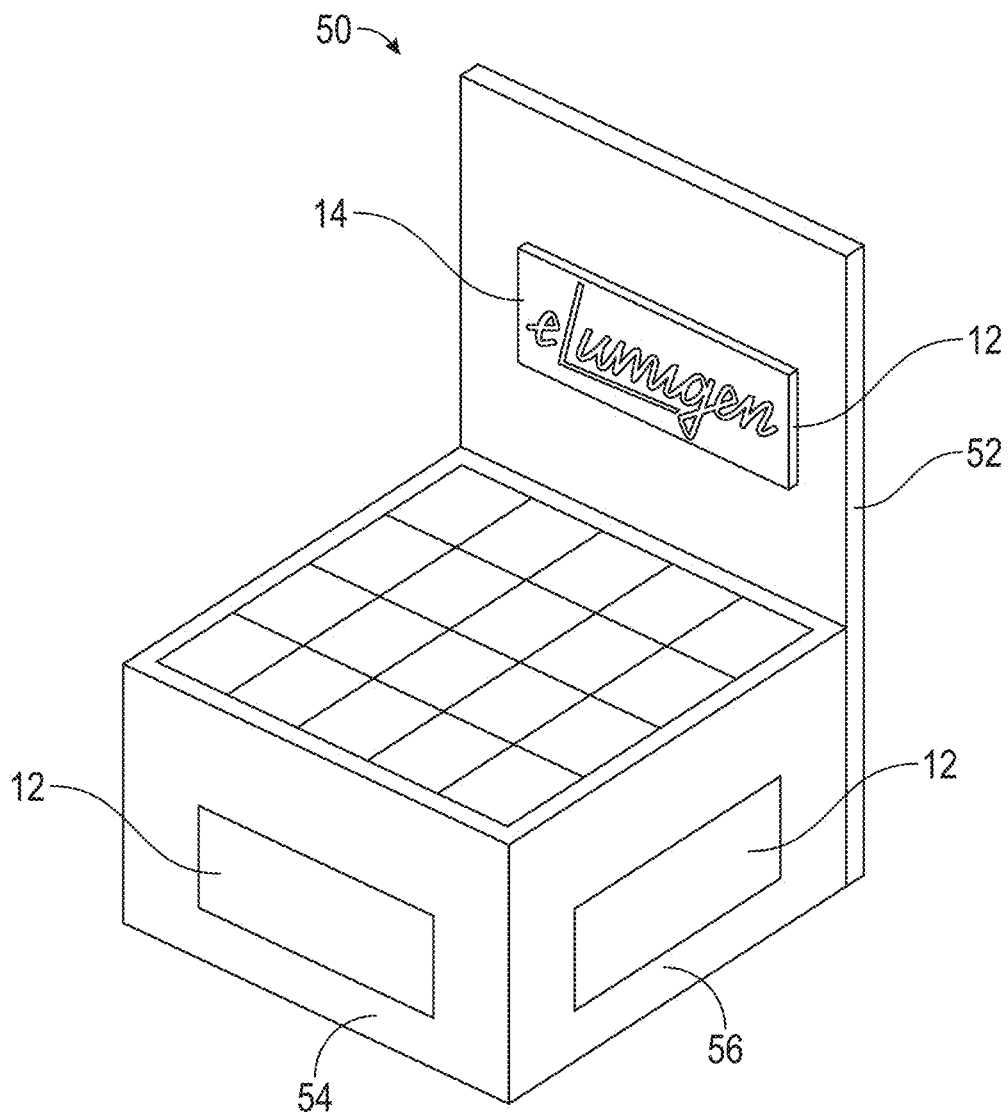
FIG. 1C is a perspective front view of a point of sale device according to the present disclosure.

In FIG. 1C, a point-of-sale display unit 50 having displays 12 formed according to one of the examples set forth below is illustrated. A back panel 52, front panel 54 or side panel 56, or combinations thereof may be all have one or more displays thereon panel 54 and a side panel 56.

Figure 2A:
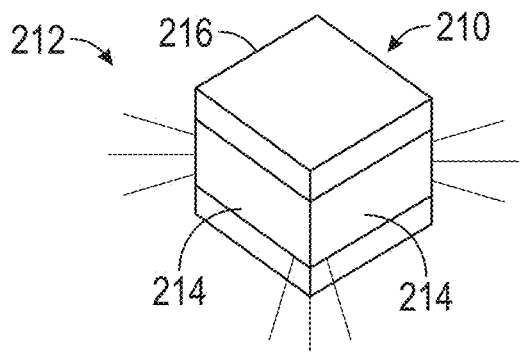
FIG. 2A is a perspective view of a 360 degree side emitting LED.

Referring now to FIGS. 2A, a 360° side emission LED 210 is illustrated. The side emission LED 210 emits light 212 from the side surfaces 214. The side surfaces 214 are perpendicular to the circuit board when mounted as illustrated below. The top surface 216 does not emit light.

Figure 2B:
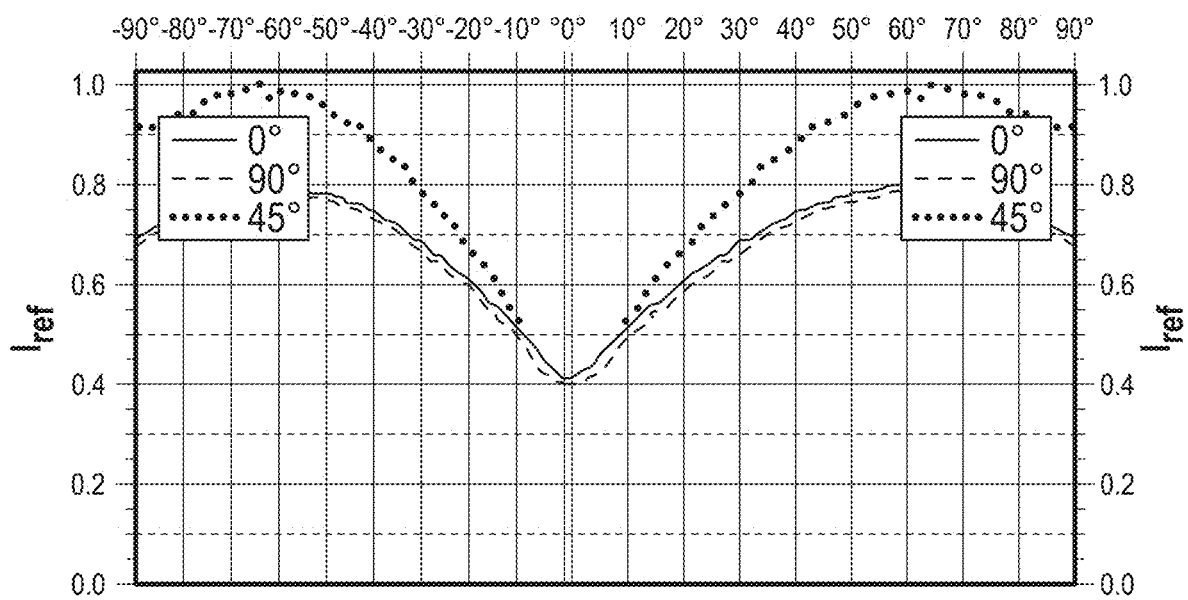
FIG. 2B is a light output plot for the LED of FIG. 2A.

Referring now also to FIG. 2B, a light output plot of the LED 210 is illustrated for various angles.

Referring now to FIGS. 3A to 3E, another example of a display 310 is illustrated in cross-section with a plurality of light sources such as light emitting diodes 312, which may be the side emitting diode 210 illustrated above. Organic light emitting diodes may also be used as the light source. The light emitting diodes 312 are mounted on a circuit board 314. The display 310 in this example has a non-addressable backlight construction. The first example is based on the interaction of indirect illumination from the LED 312 with a photon recycling cavity 320. Transflective ink 322 is screen printed on a film 324 on the front side of the cavity 320 which is then thermoformed or overmolded on the inside surface of a first portion 326A of a housing 326. The film 324 may be thermally formed with a clear plastic or composite layer 325 through which a desired graphic opening 328 is shown and illuminated to be visible when viewing the graphic. The housing 326 includes a second portion 326B that has side walls 330. The LEDs 312 emit light 332 in various directs as illustrated by the enlarged exaggerated LED 312. When a side emitting LED is used, light is not emitted from the top (surface opposite the circuit board) of the LED 312 like a typical LED. The circuit board 314 and the LEDs 312 mounted thereon create indirect radiation at the graphic opening 328 of the display 310. The light from a side emitting LED is non-Lambertian radiation that emits from the light source and is directed inside a highly reflective housing 326. The housing 326 forms the photon recycling cavity 320 which has the side walls 330 the inside surfaces of which reflect the emitted light from the LEDs 312. The walls 330 may be formed of a light colored plastic such as white or painted with a light color or white paint. Alignment of the LEDs 312 with the desired graphic is not needed as would be needed with a direct lighting configuration. The LEDs 312 are therefore not directly aligned with the graphics as shown best in FIG. 3D. Using misaligned LEDs 312 allows circuit board designers to space the LEDs 312 as necessary without regard to the optics or the display pattern. For a manufacturer, the same circuit board may be used to accommodate different designs of logos.

Figure 3A:
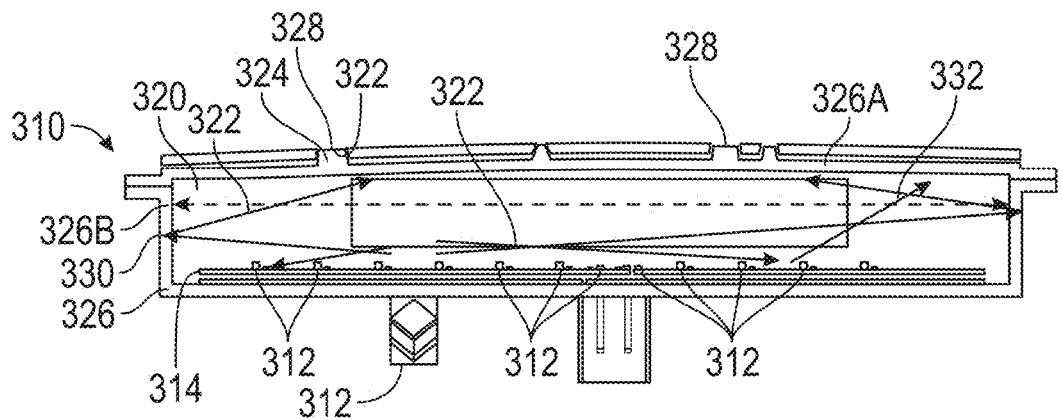
FIG. 3A is a cross-sectional view of a first example of a display according to the present disclosure.
Figure 3B:
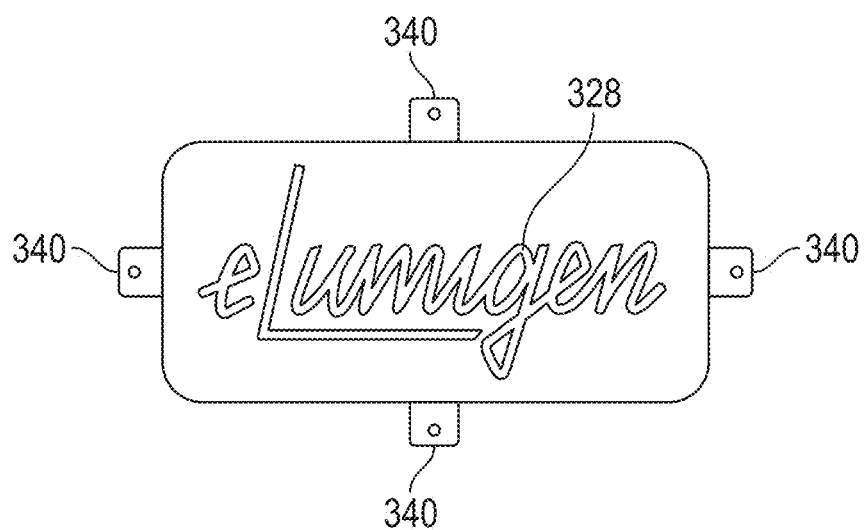
FIG. 3B is a front view of the first example of the display of FIG. 3A.
Figure 3C:
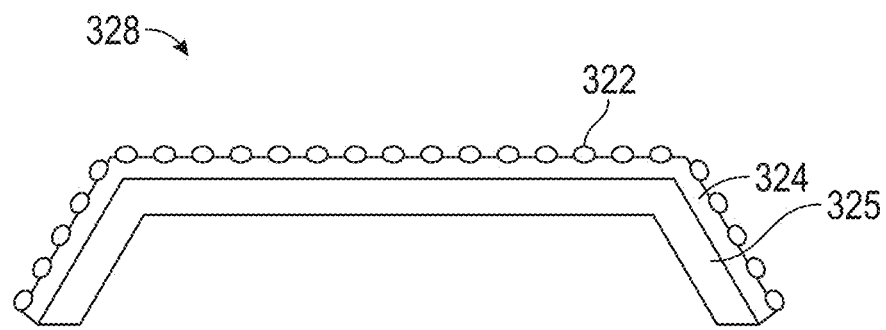
FIG. 3C is an enlarged cross-sectional view of the graphic opening of the display of FIG. 3A.
Figure 3D:
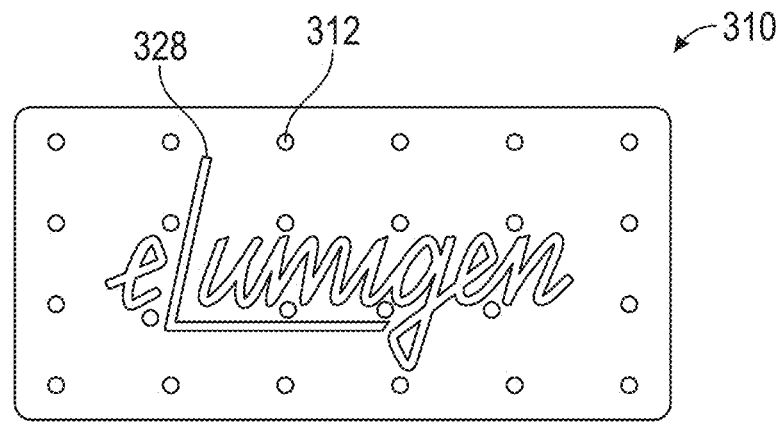
FIG. 3D is a front view of the first example of the display of FIG. 3A showing the placement of the LEDs.

The photon recycling cavity 320 is used to scatter the light 332 therein. The light 332 exits after interacting with the ink pigments and spectrally shifts by engineering the composition of the ink 322. The ink 322 may have RGB components. The spectral shift in one example was 2000K. The composition of the ink 322 defines the unique appearance of the signage. The ink 322 is printed on the clear film 324. The printed film 324 is thermal formed and back injected with the layer 325 to provide structural strength as shown in FIG. 3C.

Mounting flanges 340 may be integrally formed with the second portion 326B of the housing 326. In FIG. 3B, four mounting flanges 340 are illustrated. However, various numbers of flanges 340 may be used depending on the overall design and position of the display relative to where it is mounted.

Figure 3E:
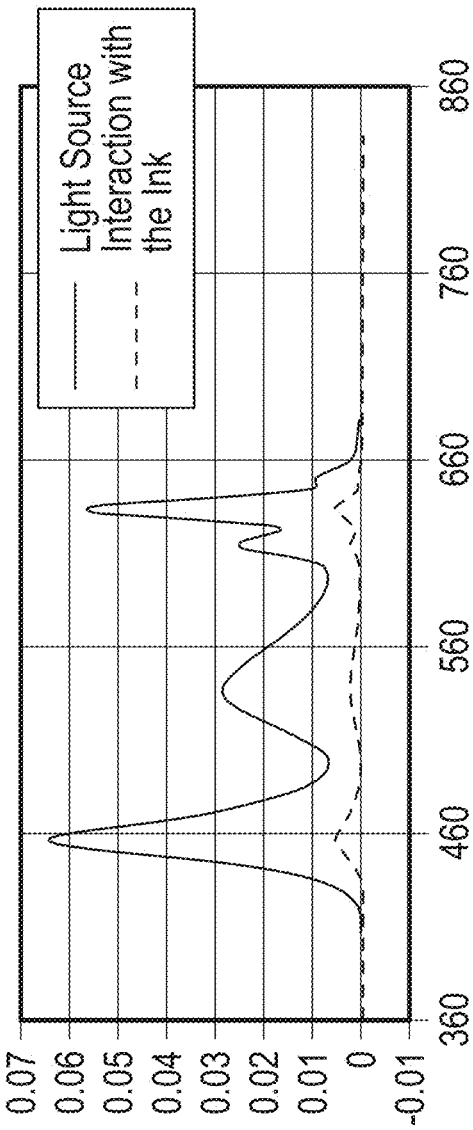
FIG. 3E is a plot of spectral shift relative to the sun.
Figure 3F:
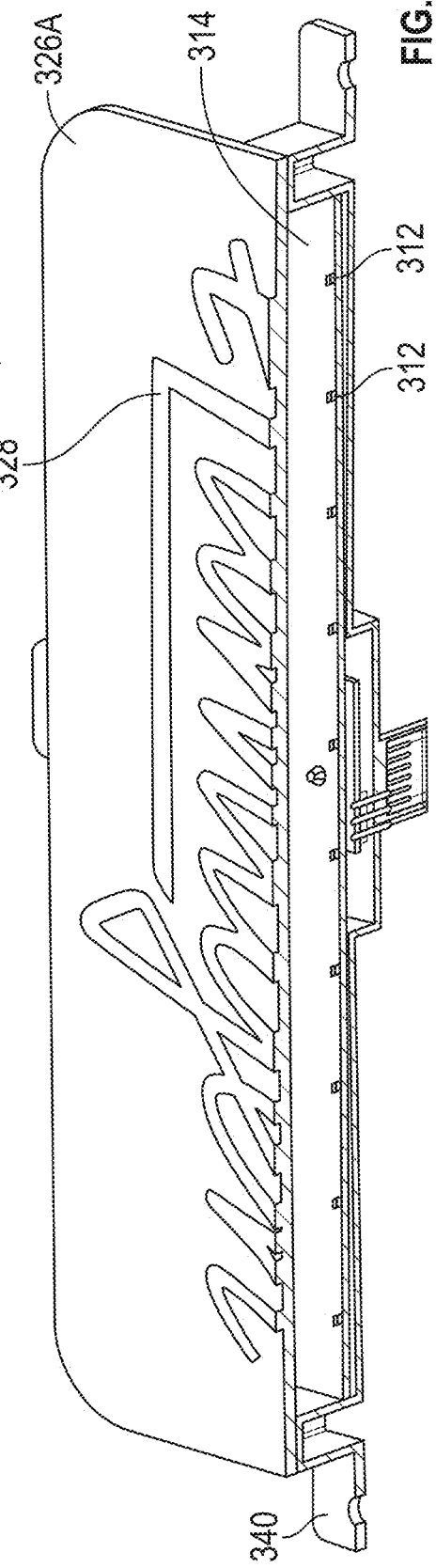
FIG. 3F is a perspective cross-sectional view of the display of FIG. 3A.
Figure 3G:
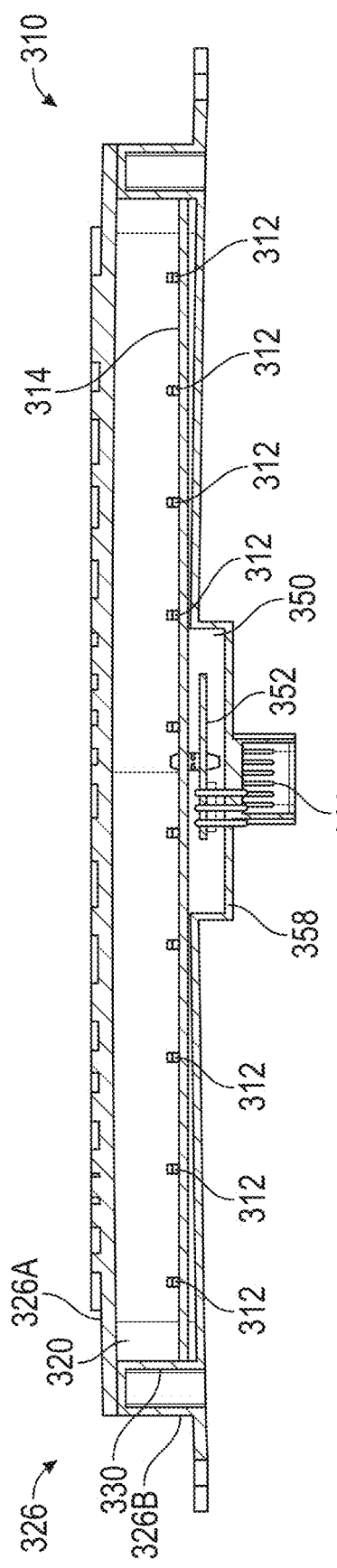
FIG. 3G is a cross-sectional view of the display of FIG. 3A.
Figure 3H:
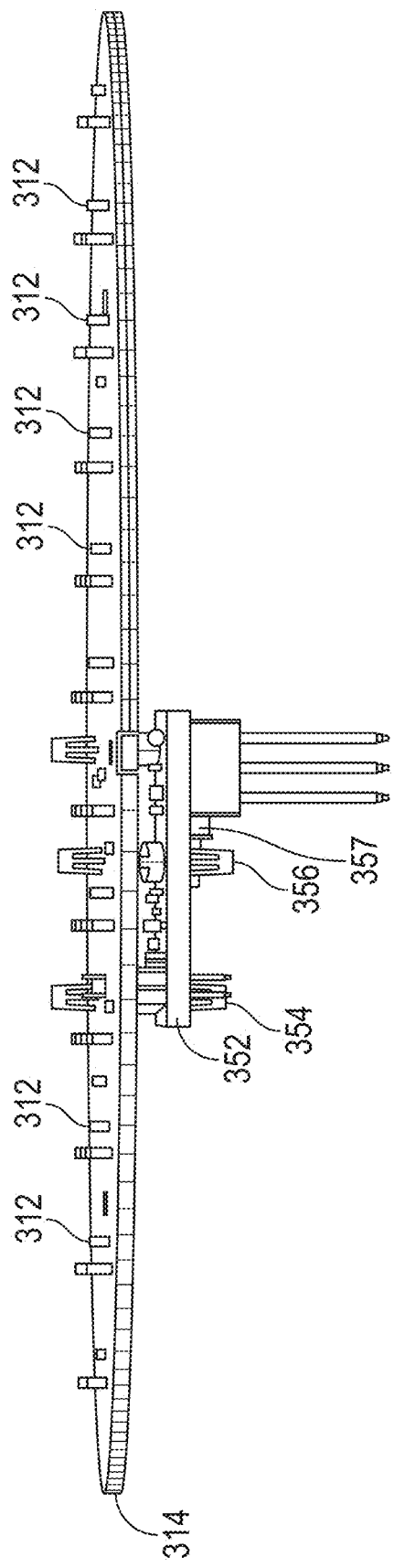
FIG. 3H is a perspective edge view of the circuit board of FIGS. 3 G and 3H.

Referring now to FIG. 3E, the daytime appearance is engineered based on the interaction of the daylight with the composition of the ink and the spectral shift from the ink is shown below for a backlighting situation. The light entering the photon recycling cavity receives and reflects outward. This allows the light generated by the LEDs 312 to add to the daylight so the illumination may still be visible in the daytime.

Referring now to FIG. 3F-I, a similar example to that set forth in FIGS. 3A-3D is set forth. Common elements are not described further. In this example, the second portion 326B has a pocket 350 that houses a second circuit board 352 that has various components such as a controller 354, a power supply 356 and a network interface 357. The power supply 356 may be a switch mode power supply or more specifically a Buck power supply as described below. The buck power supply is suitable because it is uniquely capable of powering up to 9Watts of power and operating between 9-16 Volts in the present example. This is suitable for automotive environments, in particular. A connector 360 may extend through the lower wall 358 of the pocket 350.

Figure 3I:
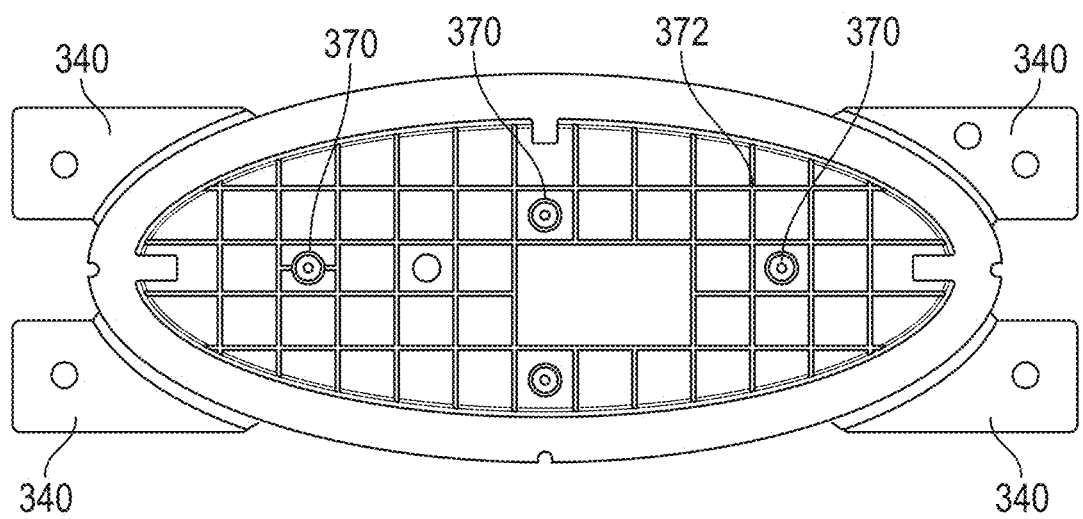
FIG. 3I is a front view of the heat sink of the display of FIG. 3A.

In order to enable backlighting for different sizes of signature elements, branded logos and architectural lighting, the back-light (circuit board and LEDs 312) in the photon recycling cavity 320 is powered on the daughter or the second board 352 packaged between the lower wall 358 of the second portion 326B of the housing and the first circuit board 314. The first circuit board 314 may be heat staked at the heat stakes 370 on to an internal heatsink 372 as shown in FIG. 3I.

Figure 3J:
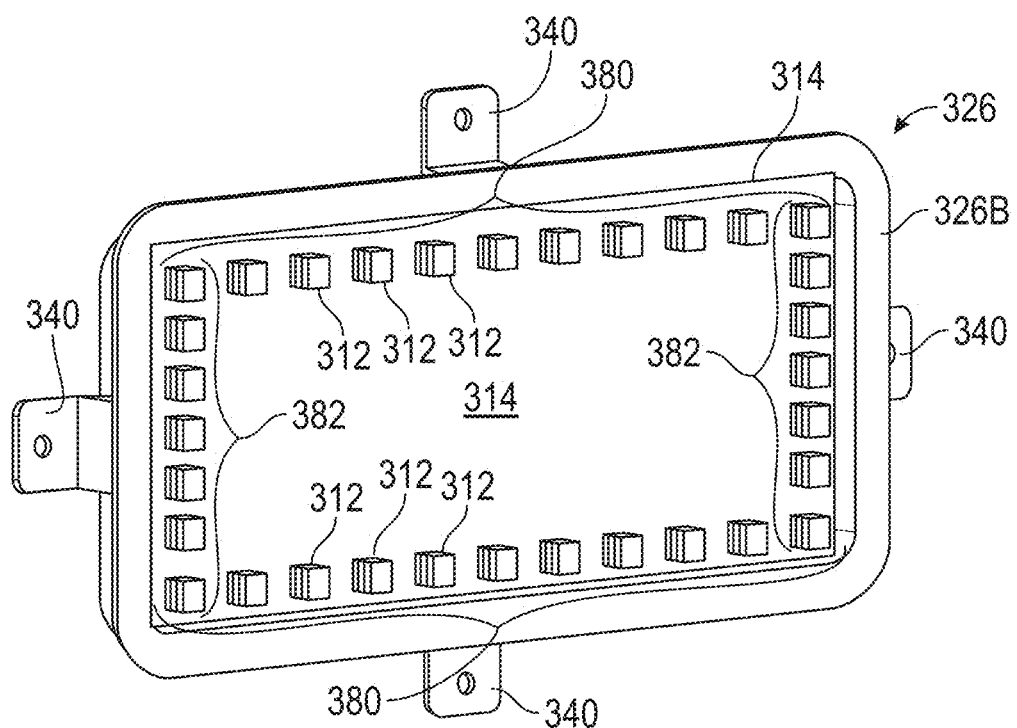
FIG. 3J is a perspective front view of a display according to another example.

Referring now to FIG. 3J, an alternate layout of the LEDs 312 on the circuit board 314 disposed in the second portion 326B of the housing 326 is illustrated. The LEDs are disposed around the perimeter, which in this example, is a rectangle. Therefore, two rows 380 connected by two columns 382 are illustrated. In this example, no other LEDs are disposed between the two columns 382 and the two rows, 380. In this manner no interference with graphics from many types of designs is present. This design may be referred to as generic since it may be used with multiple graphics. A custom first portion of the housing 326 with suitable graphics may be designed for a specific purpose while the generic second portion 326B and circuit board 314 are used.

Referring now to FIGS. 4A-D, in a second example of a display 410 is set forth coupled to a controller 448. The controller 404 may be referred to as a processor that has a memory 406 for controlling the operation of the segments of the display 410. The memory 406 is a non-transitory computer medium that includes machine readable instructions that are executable by the processor or controller. The instructions include ways to control ordered illumination of the segments in a sequence. The sequential control may provide a desired effect such as forming script. As will be described below, the display may be designed to provide consistent brightness for each of the segments and thus a table 408 in the memory 406 may store scale factors as described in greater detail below. The display 410 is a dynamically illuminated display comprising piece-wise continuous segment channels 412 formed of photon recycling cavities 414 using electronically addressable radially light emitting constructs such as light emitting diodes or organic light emitting diodes.

The second example includes piecewise linear segment channels or segmented thin light source structural elements depicting a given graphic opening or simply graphic 416. Each channel 412 consists of radially emitting illumination constructs where the radial emission uniformly fills the segment cavity with indirect light. The channels 412 and the cavities 414 are formed by a first side wall 420A and a second side wall 420. Between consecutive or adjacent segment channels 412 and cavities 414 are a shared end wall 424. At the end of the graphic 416, where no adjacent segment channel is disposed, an end wall 426 is positioned. The walls 420, 422, 424 and 426 forming the cavities 414 are highly reflective walls. The walls 420, 422, 424 and 426 may have reflective surfaces 428 that a painted with a reflective material or are formed of a reflective material such as composite material such as polycarbonate. As is best shown in FIG. 4B, a monolithic structure 429 is molded from white opaque composite to form the walls 420, 422, 424 and 426. Other structures such as bridges may also be molded from the opaque composite or plastic material. The overall size and shape of the monolithic structure may be just bigger than the overall channel size. However, the molded material may be large to extend fully within the display 410 such as to fill the rectangular size of the display of FIG. 4A. Further in a two shot injection molding process other optical components may be molded to the white opaque plastic such as couplers from clear plastic as described below.

A plurality of LEDS 430 is mounted to a first circuit board 432. In some examples, 360-degree side emitting LEDS like those described in the first example may be used without an optic. A Lambertian LED, as illustrated, may also be used. The Lambertian LED emits light outward from the circuit board 432. A segmented thin light source such as an organic light emitting diode or diodes may also be used. In FIG. 4D, the height H of the wall (the distance from the circuit board 432 may vary to form a gap 424A. That is, each cavity 414 or channel segment may have a certain amount of leakage of light to the adjacent cavity 414, the amount of which is controlled the height H.

Figure 4A:
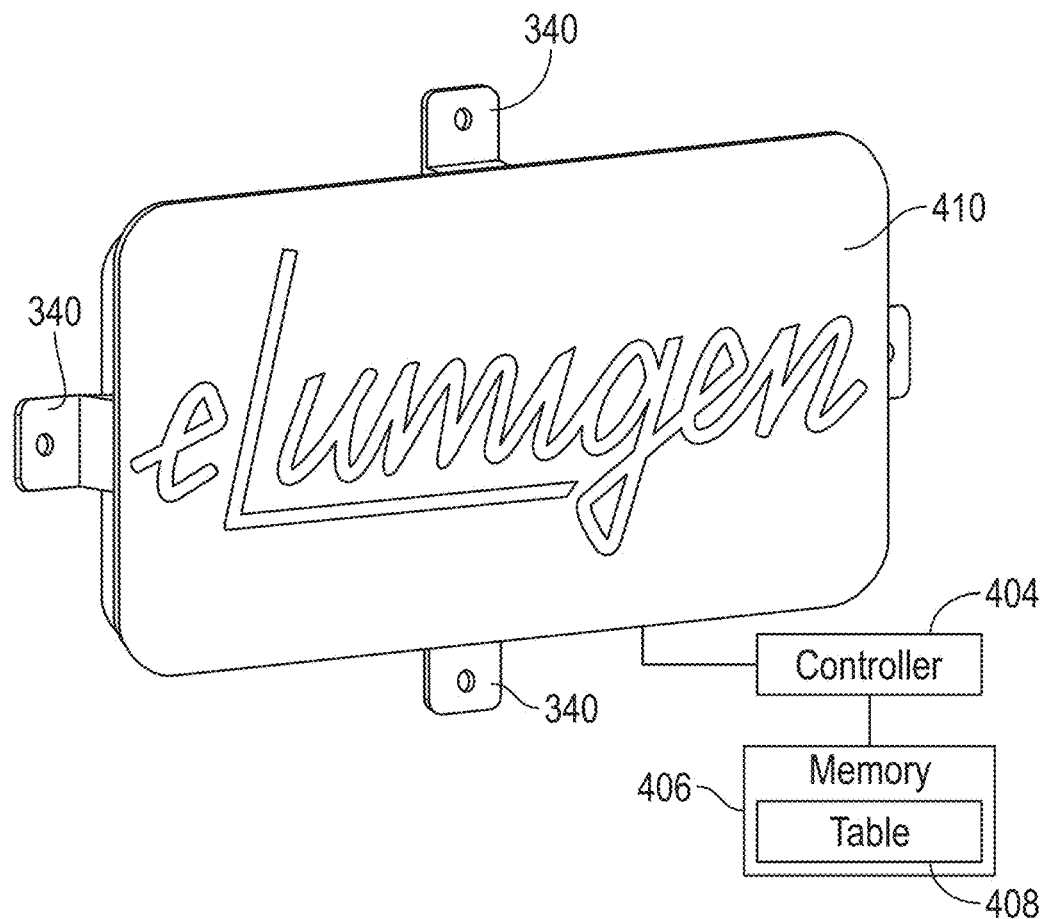
FIG. 4A is a front view of a segmented display.
Figure 4B:
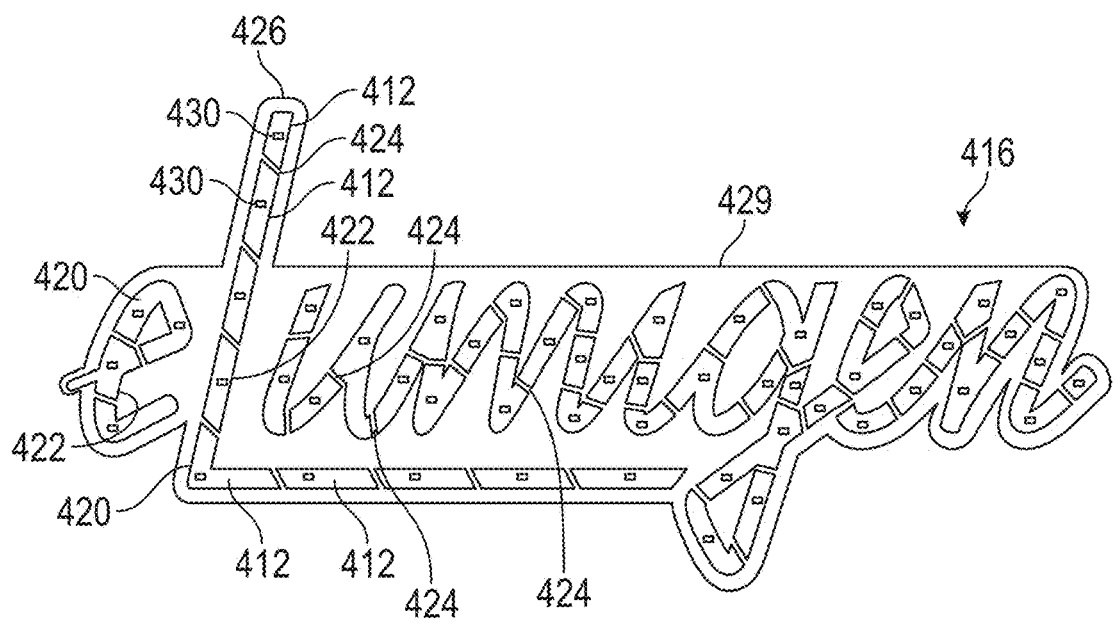
FIG. 4B is a monolithic structure having segments.
Figure 4C:
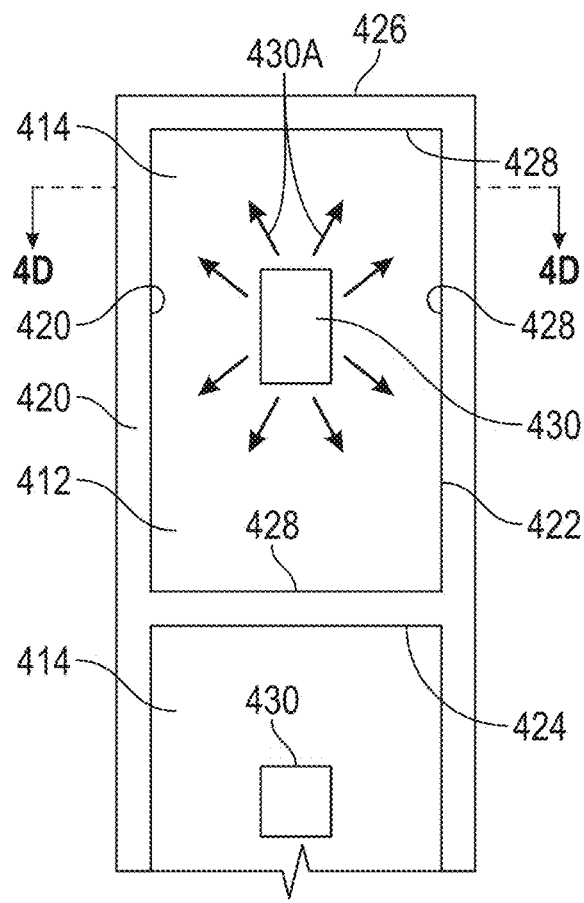
FIG. 4C is an enlarged top view of two adjacent channel structures of FIGS. 3A and 3B.
Figure 4D:
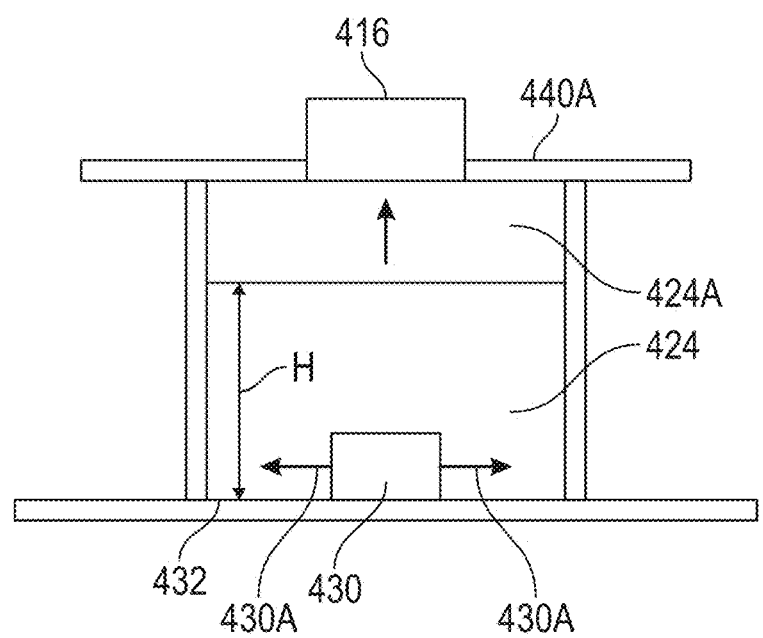
FIG. 4D is an end view of a channel of FIG. 4C.

Referring now also to FIGS. 4E and 4F, the display 410 may be formed in a similar manner to that set forth above in the first examples. The display 410 may comprise a housing 440 having a first housing portion 440A and a second housing portion 440B is formed in a similar manner to that set forth above. The second housing portion 440B may have a pocket 442 for receiving a second circuit board 444. In any of the segmented channel examples, the housing 440 may be formed in a similar manner. The height H of FIG. 4D may thus be extended to vary the gap 424A to the first housing portion 440A. The configurations of FIGS. 4A-4D may also include optics as described below.

Figure 4G:
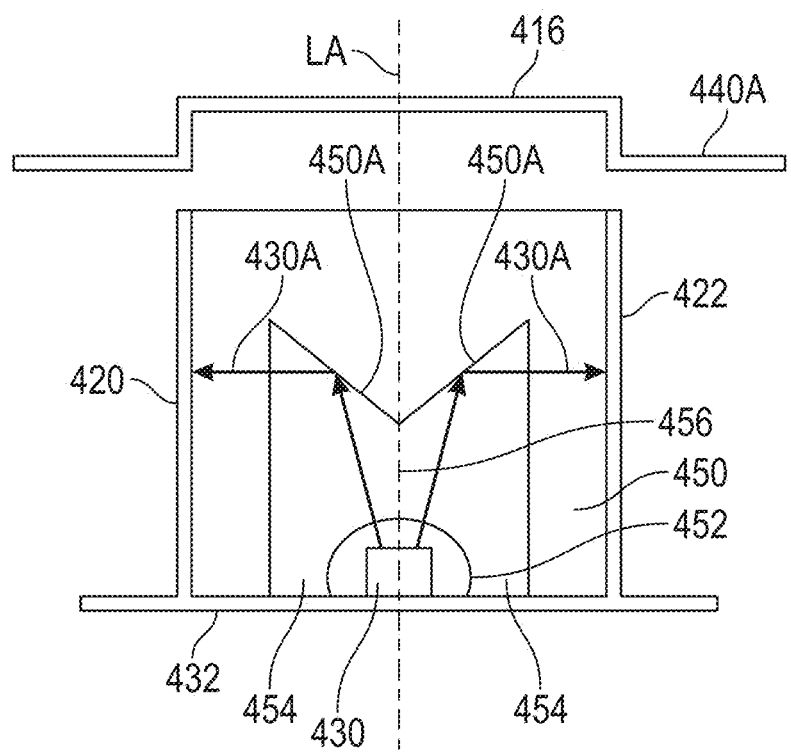
FIG. 4G is an end view of a first redirection optic.

In FIGS. 4E-4G, various examples of redirection elements for redirecting light to provide an indirect light path through the graphics 416 are set forth. The indirect light path eliminates bright spots so that an aesthetically pleasing display is provided. In a first example of a redirection element, an optic 450 is coupled to the circuit board 432 and is positioned to receive the output of the LED 430 and redirect the light 430A away from the outward direction to have the benefits of indirect lighting. The light 430A that may have been directed through the graphic 416 is completely redirected toward the side walls 420, 422 (and the coating 428, if any) of the channels 412. In this example, the solid optic 450 may be a rotated shape. The optic 450 is a cylindrical solid and has a rotated angular upper surface 450A that extends inward toward the circuit board 432 and the LED 430. The angled surface 450A is conical and through the principles of total internal reflects the light 430A away from the longitudinal axis LA of the optic 450. If the optic 450 is a rectangular solid (or cube), an inverted pyramid or cone redirects light laterally toward the side walls 420, 422 and toward the end wall 426 or shared end wall 424. In the present example, the upper surface is disposed at a 45 degrees angle to the longitudinal axis. The solid optic 450 has a recess 452 the LED 430 disposed therein near the circuit board 432. The shape of the recess 452 may be spherical so that the light incident on the surface enters the optic normal to the surface to minimize reflection. A leg or legs 454 may be used to mount the optic 450 to the circuit board 432 while allowing air flow in between if the leg or legs are discontinuous around the perimeter of the optic 450. The optic 450, this example, is cylindrical and has an inverted cone opposite the LED 430 so that the light 430A from the LED 430 reflects all around the cavity 414. Each of the segmented channels 412 and the cavities 414 may be configured the same but with slightly different channel shapes to form the desired graphic. The longitudinal axis LA of the cylindrical optic is aligned with the LED 430 and the apex 456 of the cone. All of the light 430A from the LEDS 430 is initially redirected away from the graphics 416. The cavities 414 are photon recycling piece-wise continuous cavities that eventually emit the light 430A from the graphic 416 after reflection from the walls 420, 422, 424 and 426 of the display 410.

The second circuit board 444 has various components such as a controller 354, a power supply 356 and the network interface 357 (as described above). Each illumination construct in the cavities 414 may be addressed electronically based on the network the dynamically illuminated signage belongs to. The networks could be Wi-Fi, ZigBee, a CAN of a vehicle, CAN-FD, Ethernet etc. The electronic controller 354 that interfaces the network through the network interface 357 and the power supply 356 to power the radial light emitting constructs are on the second circuit board 444 as shown below.

The graphic 416 may be formed as described above with transflective ink formed on a film and injected with thermal plastic. The cavity has side walls that are in the longitudinal direction of the segmented graphics.

The controller 354 may be used to control the sequence, the slope of the ramp up voltage and other characteristics of the graphics presentation of the display 410. In script writing, for example, as the LED 430 of a first cavity 414 is powered up, the first cavity 414 takes some time to fill with light as power to the LED 430 is ramped up. A small amount of light eventually can leak through the gap 424A between top of the shared end wall 424 and the first housing portion 440A before proceeding to illuminate the next cavity 414 in the next segment of the sequence. This can be controlled by sizing the height H of the shared end wall 426 appropriately to allow no leakage or by providing a controlled amount of leakage. In some constructs, the gap 424A may be minimized. Therefore, the illumination looks like a smooth script being written rather than choppy segments being turned on sequentially. That is, the height H of the shared end walls 424 is used to control the gap to provide a controllable transition from segment to segment. In many instances, the light bleeding through is minimized.

The dynamically addressable radial construct can be electronically accessed based on the scenarios, situation or the messages one wants to communicate. If the signage is the signature of an individual, it can be addressed based on the way the individual executes the signature. If the message is continuous the radially emitting constructs could be accessed accordingly. If the message is wanning, the LEDS can be accessed accordingly. Depending on the packaging constraints these structures could also contain Infrared, Red, Green, Blue, White and UV light sources or combinations thereof to change the effects of the message.

Figure 4H:
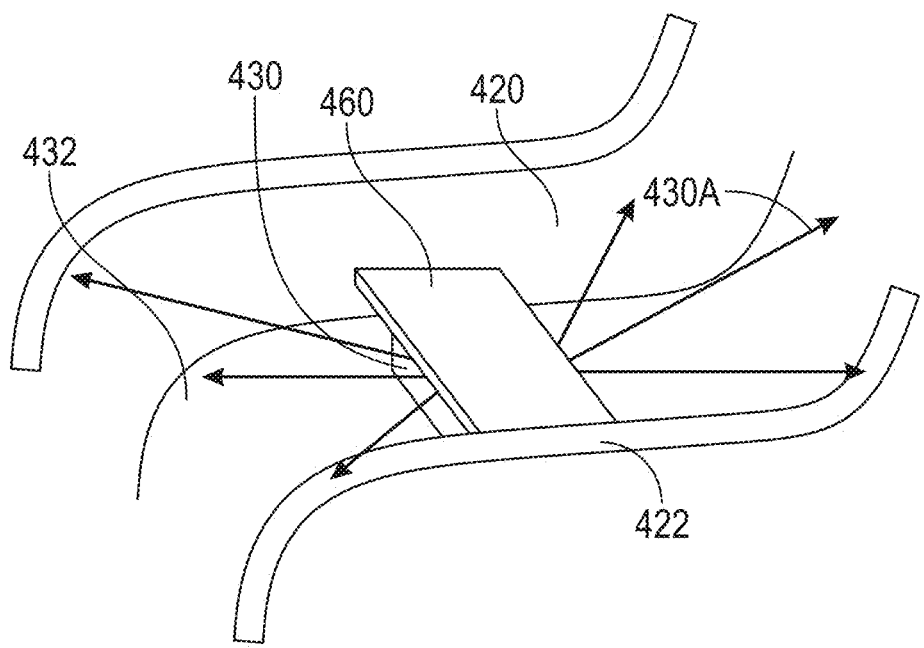
FIG. 4H is a is a perspective view of a channel having a second example of a redirection element.
Figure 4I:
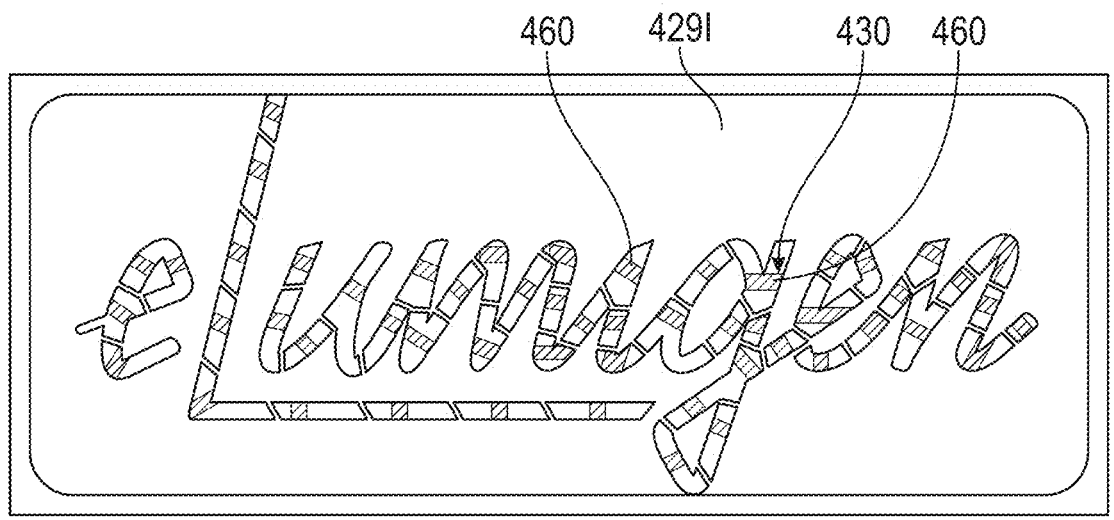
FIG. 4I is a is a top view showing the position of the second redirection elements.

Referring now to FIGS. 4H and 4I, another example of a redirection element is illustrated. A bridge 460 may be placed over the top of the LED 430 so that the bridge 460 is between the LED 430 and the second portion 440A of the housing 440. The LED 430 is not in alignment with the graphic 416 so the light 430A bounces from the walls 420 and 422. Although a small portion of the LED 430 is illustrated, from the top-down view of FIG. 4I, the LED 430 (one of which is represented) is covered by the bridge 460. The bridge 460 may be spaced apart from the LED 430 to allow sufficient space for thermal considerations. However little or no space may be left between the bottom of the bridge 460 and the LED 430. The distance between the bottom of the bridge 460 and the top of the LED 430 may therefore vary. The bridge 460 has a width that is sized based on the LED characteristics to prevent direct light from leaving through the graphics 416. That is, reflected/redirected light fills the cavity, when there is a scattering bridge in the piece-wise continuous photon recycling cavities 414.

The bridge 460 may be integrally formed with the walls 420, 422 alone or part of a monolithic structure 419' as illustrated in FIG. 4I.

Another advantage of the scattering bridge is that a six pin RGB LEDs could be packaged underneath the scattering bridge, so that other features to the signage could be attributed such as charge state indication, pedestrian protection in the transportation sector, safe or unsafe use of an item, and ingress egress signage in the buildings.

Figure 4J:
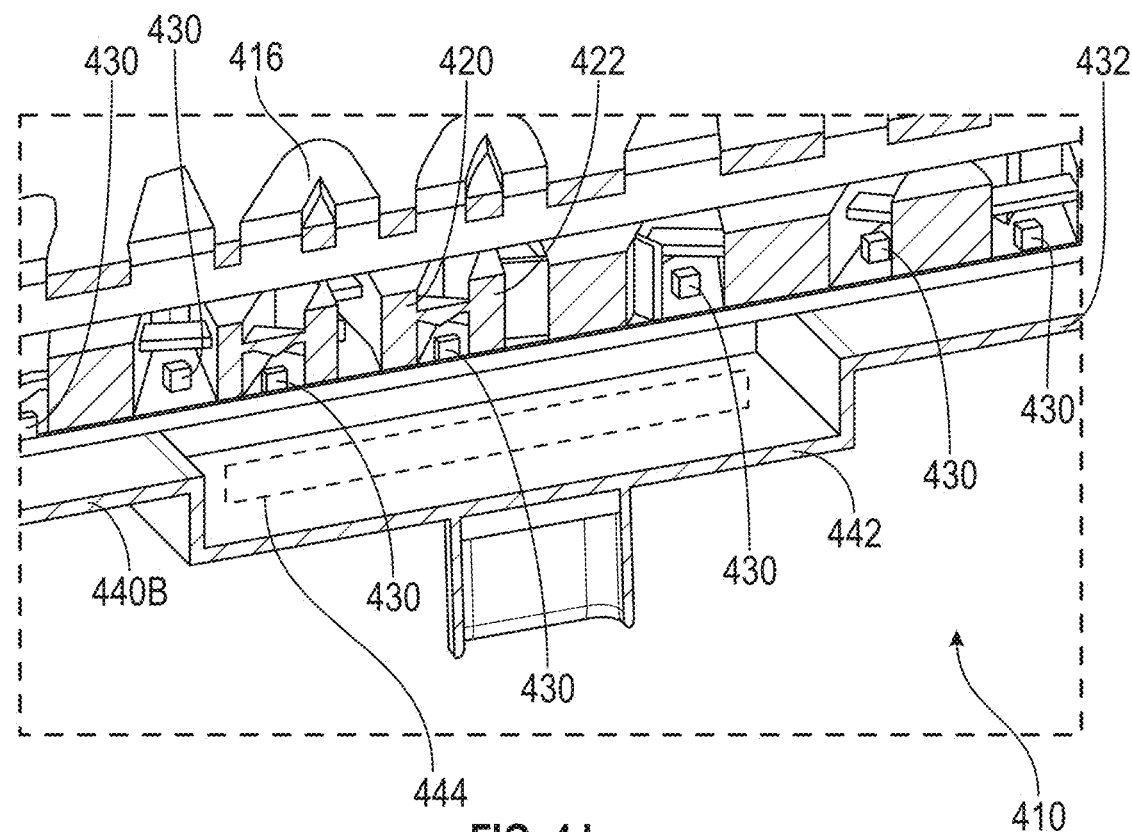
FIG. 4J is a cut away perspective view of another example of a redirection element.

Referring now to FIGS. 4J and 4K, another example of a redirection element a bridge 460' is set forth. The bridge 460' is integrally formed or molded with the walls 420 and 422. In this example, the bottom surface 462 of the bridge 460' has a redirection wall 464 or walls extending therefrom. The redirection wall or walls 464 may be a conical surface or 3 to 6 surface pyramidal structure extending toward the LED from the bottom surface 462 of the bridge 460'. The walls help the dispersion of light particularly with Lambertian distribution or top distribution LEDs.

Referring now to FIGS. 4L and 4M, an alternative redirection element from FIGS. 4H and 4I is set forth. The bridge 460 is opaque plastic that has a clear plastic coupler 468 such as polycarbonate disposed between the bottom surface 462 of the bridge 460 and a top surface 430B of the LED 430. The coupler 468, in this example, is a rectangular solid such as a cube bridge 460. This example is useful to redirect light from the LED so that neither the light nor the LED is in alignment with the graphic opening 416. The formation of the coupler 468 may be performed with a two shot injection molding process where opaque material is used to form a monolithic structure including the walls 420, 422 and bridge 460 in a first shot and in a second shot form the coupler 468 to the opaque material.

Referring now to FIGS. 4N and 4O, an alternative redirection element from FIGS. 4J and 4K is set forth. The bridge 460' is opaque plastic and has a clear plastic coupler 470 such as polycarbonate disposed between the bottom surface 462 of the bridge 460' and a top surface 430B of the LED 430. The coupler 470, in this example, is a cylindrical solid having a conical wall 472 extending inward toward the LED 430 directly adjacent the wall 464 extending from the bottom 462 of the bridge 460'. This example is useful to redirect light from the LED so that neither the light nor the LED 430 is in alignment with the graphic opening 416. The formation of the coupler 470 may be performed with a two shot injection molding process where opaque material is used to form a monolithic structure including the walls 420, 422 and bridge 460' in a first shot and in a second shot form the coupler 470 to the opaque material.

Figure 4Q:
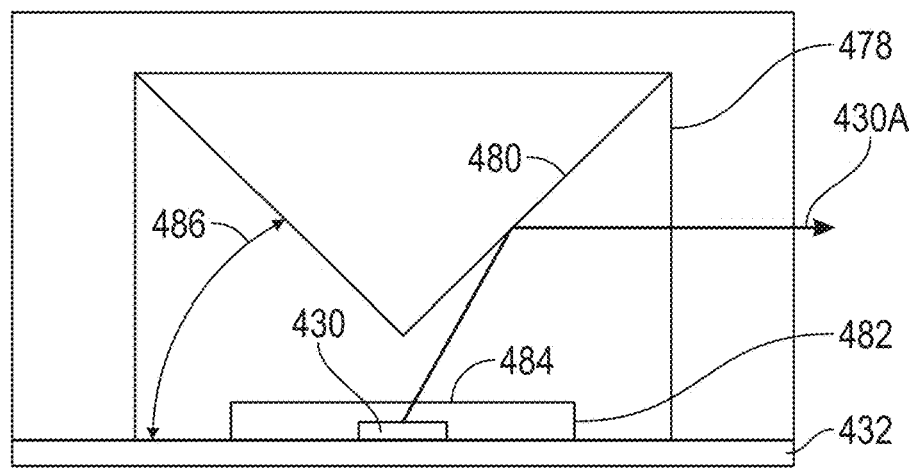
FIG. 4Q is a side view of a coupler of FIG. 4P.
Figure 4R:
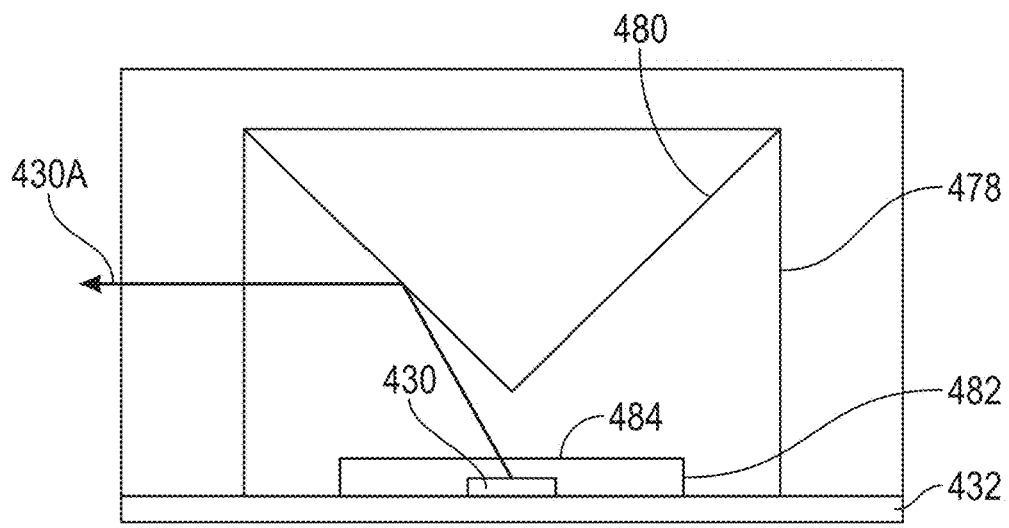
FIG. 4R is a side view of the coupler of FIG. 4A with a concave upper surface.
Figure 4S:
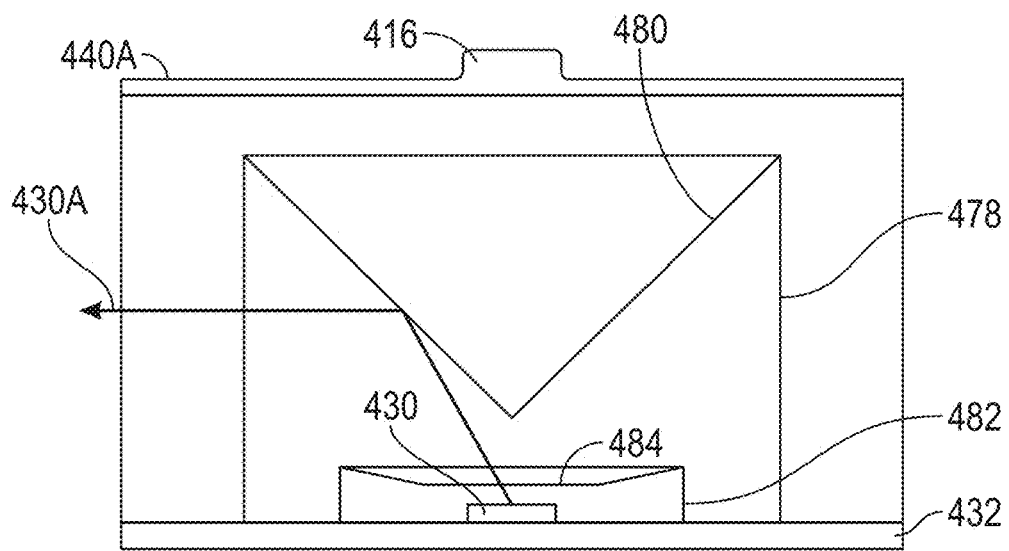
FIG. 4S is a side view of the coupler of FIG. 4A with a convex upper surface.

Referring now to FIGS. 4P-4S, examples of a clear plastic couplers 478 made of a clear composite such as polycarbonate is set forth as a redirection element. The couplers 478 are disposed on the circuit board 432 and surround the LED 430 without using a bridge as set forth above. The coupler 478, in this example, is a cylindrical solid having a first end having a conical wall 480 extending inward toward the LED 430. A second end of the coupler 478 has a recess 482 that houses the LED 430 when assembled. The difference between FIGS. 4Q-4S is that the recess 482 has an upper surface 484 that is parallel to the circuit board 432 in FIG. 4Q, concave as in FIG. 4R or convex as in FIG. 4S. The shapes of the concave and convex surface may be spherical or conical sections depending on the angle and dispersion of the desired output. The angle 486 of the conical wall 480 may vary as well such as between 45-50 degrees. Various combinations may be used depending on design considerations. This example is useful to redirect light from the LED so that neither the light nor the LED 430 is in optical alignment with the graphic opening 416.

Figure 4T:
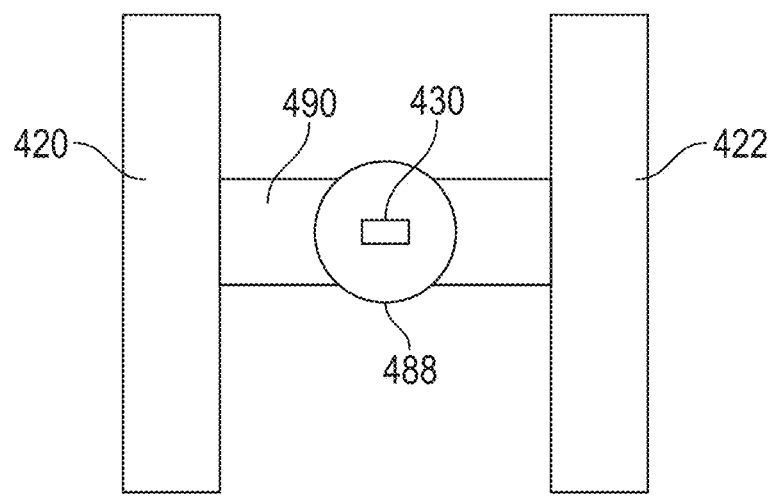
FIG. 4T is a top view of another example of a redirection element.
Figure 4U:
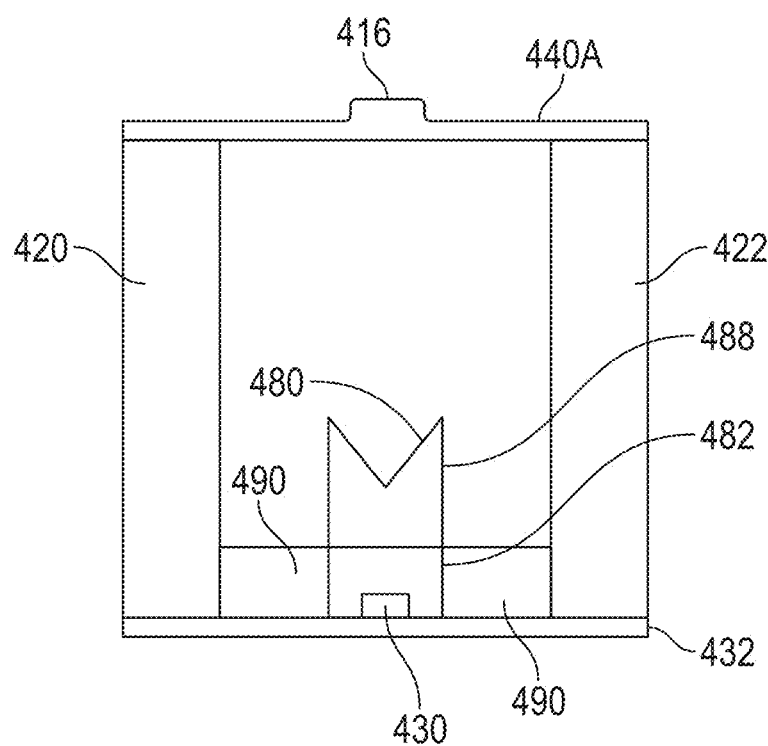
FIG. 4U is a side view of the couple of FIG. 4T.

Referring now to FIGS. 4T and 4U, a top view and side view of an alternate configuration of an optic 488 as a redirection element is set forth. The optic 488 is similar to that in FIGS. 4P-R and therefore the common elements are labeled the same. In this example, the recess 482 is relatively larger. Supports 490 space the optic 488 away from the circuit board 432. The recess 482 in this example does not surround the LED 430. In this example, the supports 490 and the optic 488 may be a monolithic structure itself or may be formed as a second shot of the monolithic structure (first shot) forming the supports 490. The top of the optic 488 may be shaped as a conical surface 480 as described above with varying angles also described above. All the light from a top emitting LED is redirected laterally from the optic 488 so that the light must bounce before leaving the graphic opening.

Figure 5A:
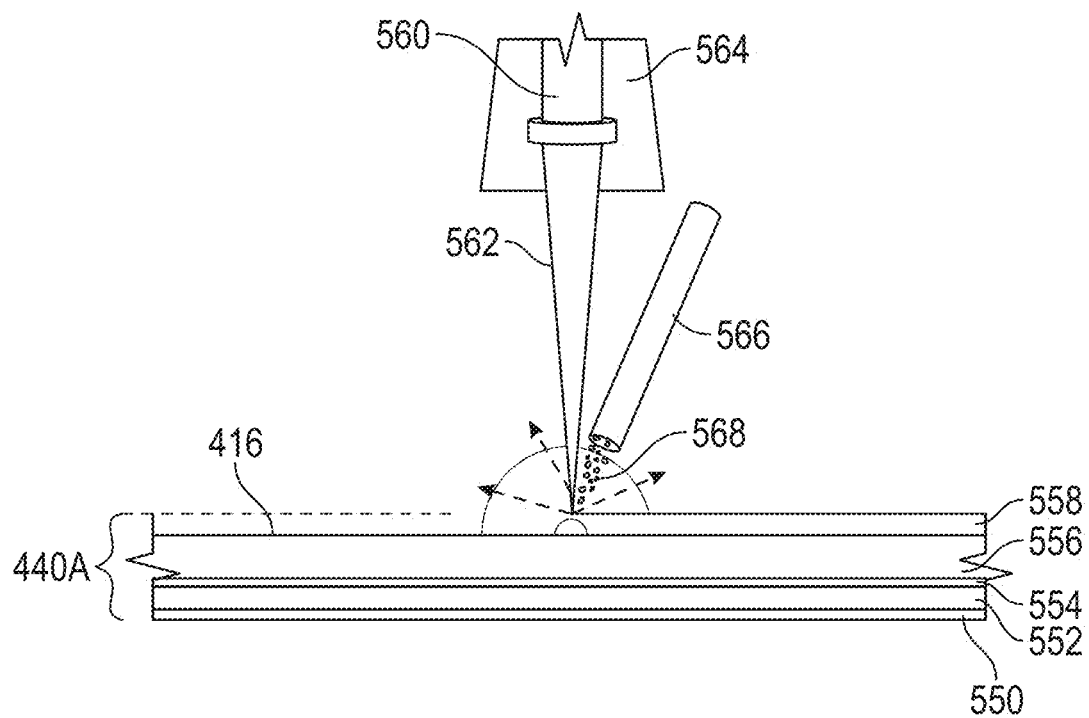
FIG. 5A is a side view of a laser ablation system.
Figure 5B:
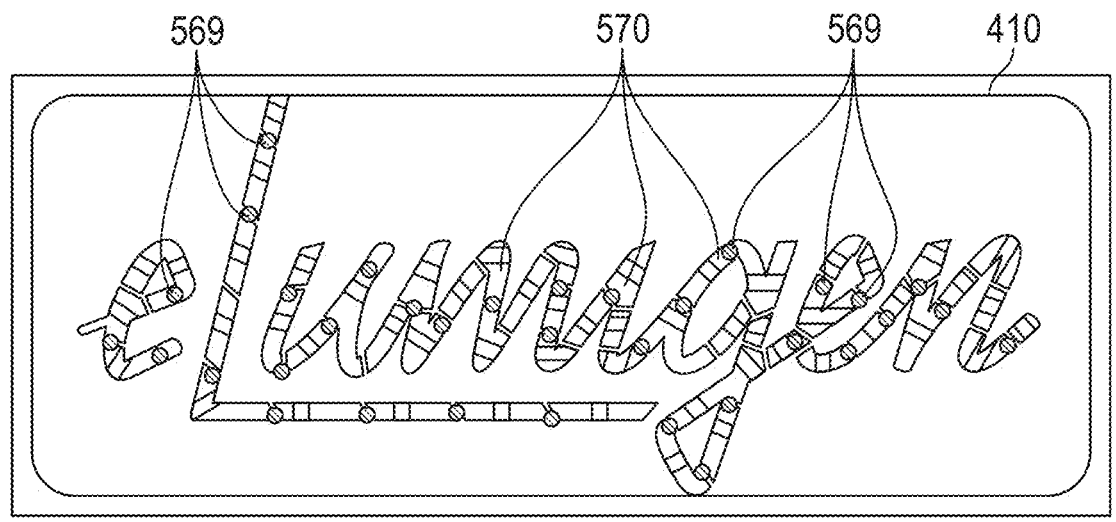
FIG. 5B is a top view of a multi-laser positioning system.

Referring now to FIGS. 5A and 5B, local laser ablation may be used to form the graphic opening 416 in the first portion 440A of the housing 440. The first portion 440A may be formed in many ways with many different layers as described above. For example, a clear plastic injected layer 550 may be used to protect a film layer 552 that has transreflective ink 554 applied thereon. The layers 550 through 554 may be applied to a substrate 556. The substrate 556 may be completely coated with a coating 558 such as paint. To expose the substrate or a coating layer under the coating 558, the coating 558 may be selectively removed to form the graphic 416. Laser ablation is based on a line of site laser 560 using a laser beam 562 traveling above the painted or coating on the surface of the substrate 556 lifting the layer of coating 558 to show the substrate color for the graphic 416 that the laser is creating. In order to create the graphic 416, the laser 560 is traveling on a programmable robotic head 564 following the pattern of the graphic 416. A vacuum 566 is used to remove particles of the coating of the This method using a single laser 560 is not conducive for very high-volume creation of laser ablated graphics, due to the time it takes. Hence, reflective material as aluminum may have multiple expanded lasers 560 attached thereto to align with each of the piece-wise segmented cavities 570 to fire all of the lasers simultaneously based on the power required to do laser ablation of a given coating or paint for a given segment as shown in FIG. 5B. Each laser may therefore use a different amount of power. The power required is based on mW/area that needs to be impinging on the paint surface associated with the graphic segment.

Another approach to using lasers may be using different optical fibers in the middle of the cavities (at the positions 569) and the fibers could be bundled to form the input end for a high-powered laser. But the input to the fiber tip above the graphic may not be controlled. Hence, the distance of the fiber tip to the substrate and the angle of emission could be controlled to manage the power density hitting the substrate, via each piece-wise segment.

Figure 6A:
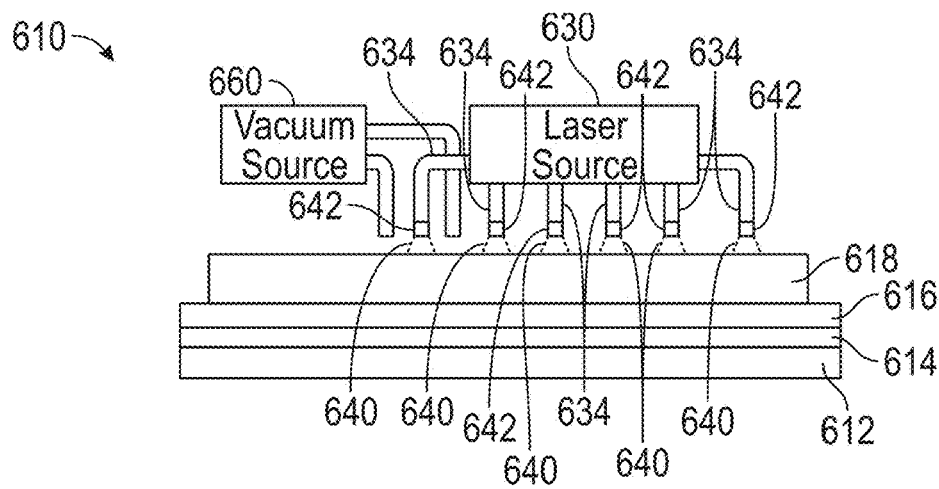
FIG. 6A is a diagrammatic view of an ablation system according to the present disclosure.

Referring now to FIG. 6A, a system 610 for ablating layers from a substrate 612 is illustrated. The substrate 612 has one or more coating layers such as paint thereon. In this example, a first layer 614 is a layer of white paint that is translucent. A second layer 616 is disposed on the first layer 614. The second layer 614 may be a paint or another type of coating and may be translucent or opaque. The substrate 612 may be coated fully by both layers 614 and 616. To form a display, the second layer 616 is removed to expose the white layer 614 so that light positioned behind the substrate 612 may be transmitted therethrough. Various numbers of layers such as one layer of three or more layers may be used. Layers may be selectively removed as needed to achieve the desired effect.

Figure 6B:
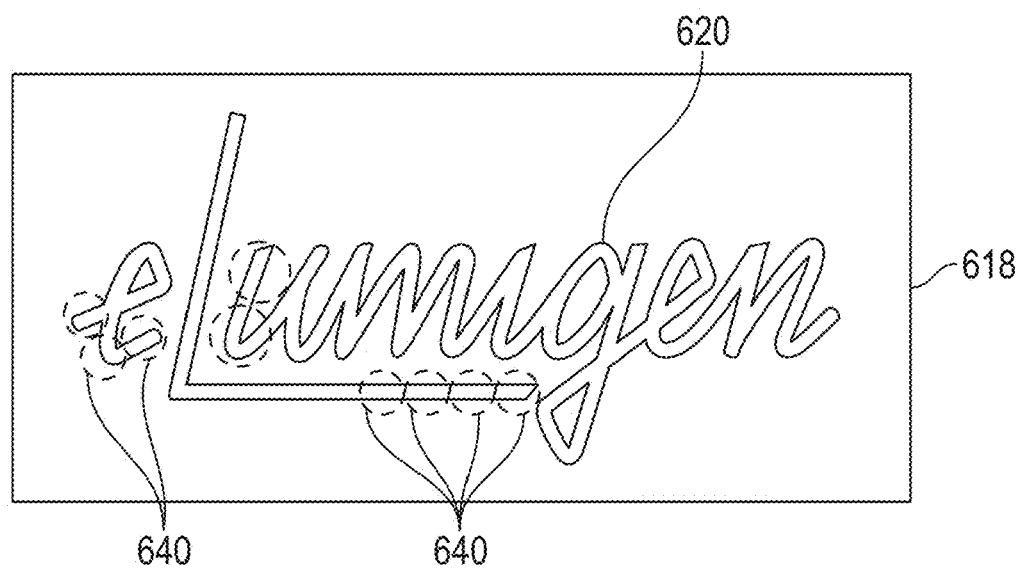
FIG. 6B is a top view of a guide according to the present disclosure.

Referring now also to FIG. 6B, a guide 618 having a pattern 620 therethrough is set forth. That is, the guide 618 may be formed of a metal such as aluminum to reflect and not absorb laser light. The pattern 620 may be various shapes and correspond to the color to be displayed by the display.

Figures 6C, 6D:
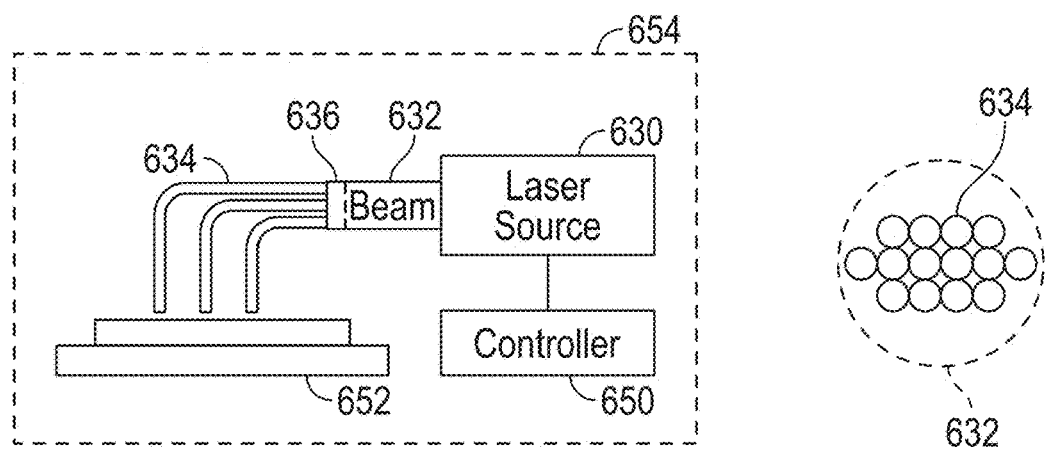
FIG. 6C is a diagrammatic view of a control system for forming the display.
FIG. 6D illustrates a plurality of optical fibers receiving a laser beam.

Referring now also to FIGS. 6C and 6D, a laser source 630 is used to generate a laser beam 632. The laser beam 632 is coupled into a plurality of optical fibers 634. The plurality of optical fibers 634 may be bundled together to receive the laser beams 632. The laser beam 632 is thus divided into the plurality of optical fibers 634 to form sub-beams 640 within each of the optical fibers 634. The sub-beams 640 are emitted from the ends of each of the optical fibers 634. The sub-beams 640 may cover the entire pattern 620 so that the simultaneous ablation of the layer 616 may take place simultaneously. As is illustrated best in FIG. 6B, the sub-beams 640 may extend beyond the pattern 620 so that when placed adjacent to each other coverage of at least the openings of the pattern is covered by the sub-beams 640. In FIG. 6B, only a portion of the sub-beams 640 simultaneously generated are illustrated.

Referring back to FIG. 6C, the laser source 630 has a controller 650 coupled thereto. The controller 650 is used to control the operation of the laser beam 632 such as the duration of the beam. The duration of the laser beam 632 is such to provide an amount of energy to the layer 616 to ablate or remove the layer at the position of the laser sub-beams 640. Any overlap outside of the pattern 620 is blocked by the guide 618 so that only the areas of the coating within the pattern 620 are ablated or removed. The beam 632 may have an optic 636 that promotes the coupling of the laser beam into the optical fibers 634.

The other end of the optical fibers may have an optic 642 that allows even distribution of the energy of the sub-beam 640 at the second end of the optical fibers 634. An even distribution will allow even ablation across the entire sub-beam and the entire pattern 620, no matter where in the pattern the sub-beam 640 is incident.

A vacuum source 660 may also be provided adjacent to the optical fiber 634 and the sub-beam 640 generated thereby. The vacuum source 660 may be used for removing the particles ablated from the first layer 616.

In operation, the controller 650 is used to control the layer source 630 to generate the laser beam 632. When the laser beam 632 is generated, the laser beam is coupled into the optical fibers 634 to form the sub-beams 640 which are sized to have a sufficient amount of energy to ablate or remove the layer 616 from the substrate 612.

This design may also be used for various numbers of layers and sublayers. For example, the sublayers 614 may be different colors so that when the layer 616 is removed, the display may generate different colors. This may be suitable for displays in which, for example, the first letter of a display may be desired to be displayed in a different color.

The number of layers is illustrated as two in FIG. 6A. However, more translucent layers may be provided. For example, an intermediate layer between the layer 614 and the layer 616 may also be provided. In some locations, the laser sub-beams 640 may be tuned to remove the intermediate layer between the layers 614 and 616 as well as the outer layer 616. At other sub-beams, the layer 616 may be removed. When the controller 650 acts to form the beam 632, the ablation may be referred to as a "flash" ablation because the ablation is performed at the same time with all the sub-beams. The controller 650, the laser 630, and a fixture 652 for holding the substrate may be part of an automated processing machine 654.

In the following figures, alternate designs for displays are set forth. In the following, segmented spatial light modulators that use surface emissions for contrast enhancement are set forth. Segmented thin light sources (surface emitters) are used. The displays may be used for displays on vehicles as well as for disinfecting purposes when UV light sources are used.

Figure 7A:
FIG. 7A is an exploded view of a display having a back light and a shutter device.
Figure 7B:
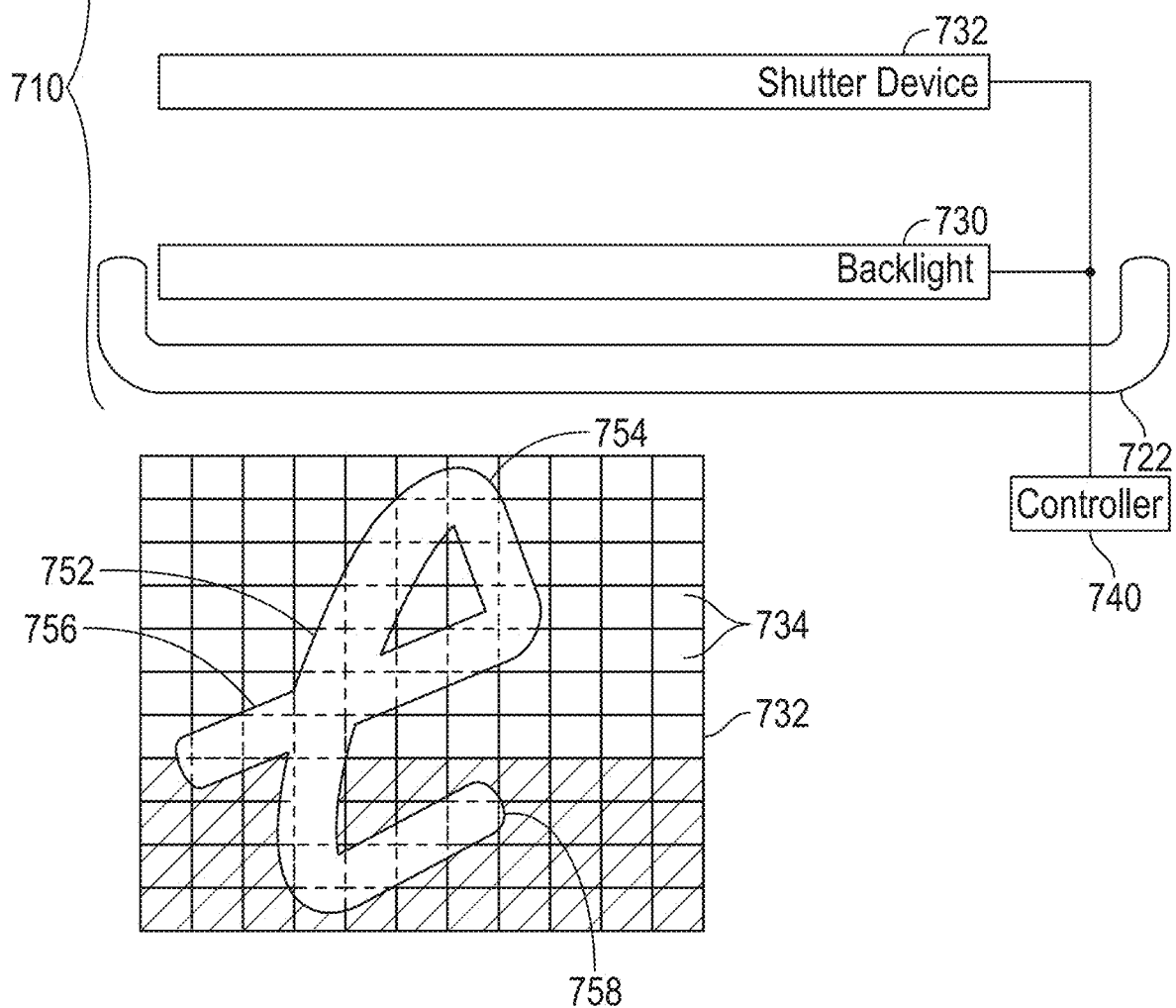
FIG. 7B is an enlarged portion of the display with controllable elements at the shutter device.

Referring now to FIGS. 7A and 7B, a display 710 has a substrate 712 that may include an inside layer 714 that is made with transflective material as described above. On the opposite side of the substrate 712, a first layer 716 is disposed on the substrate 712. The first layer 716 may be a display color such as white. A second layer 718 is disposed on the first layer 716 and forms a background layer in a similar manner to that described above. The substrate 712 may be formed according to that illustrated in FIG. 6. The substrate and the layers may be referred to as a substrate assembly 720. The substrate assembly 720 may be coupled to a housing 722. The substrate assembly 720 may be coupled in various ways to the housing 722 using fasteners, seals, adhesives, vibration welding and the like. The display 710 includes a backlight 730. The backlight 730 may be a thin surface emitter that generates surface emissions. The backlight 730 generates light in the direction of the substrate 712. The backlight 730, in this example, may be continuously on. To control the display 710, a shutter device 732 may be disposed between the backlight 730 and the substrate assembly 720. The backlight 730 and the shutter device 732 may be selectively controlled by a controller 740. The controller 740 may be a matrix controller that controls elements 734 of the shutter device 732.

In FIG. 7B, a plurality of elements 734 are illustrated that may be controlled by the controller 740. The size of the elements 734 may vary. By controlling the elements 734 from an on state to off state or states therebetween, the amount of light through the graphic portion 750 may be controlled. That is, the controller 740 selectively controls the elements 734. In FIG. 7B, an arrow 752 illustrates that the elements may be controlled to form a script. That is, the elements 734 from the start of the arrow to the arrowhead may be controlled in a sequential fashion to allow the display 710 to be illuminated sequentially in a direction. In this example, the lower case "e" 754 is illuminated from a first end 756 to a second end 758 by sequentially controlling the elements 734, which can have appropriate sizes size or pitches. Of course, the entire logo or display may be illuminated in various ways and in various sequences to form the desired display and the effect of the display.

In an automotive vehicle, the display 710 may perform differently under different conditions. For example, during charging of an electric vehicle, the display may slowly cycle from on to off and back to on again. For a turn signal, when the turn signal indicator is on and flashing, the display 710 may turn on sequentially in the direction of the turn signal. Of course, other effects may be performed. As mentioned above, the display 710 may be part of a logo on the front grill or on the front of the vehicle or the rear of the vehicle. On the rear of the vehicle, the display may act as an additional taillight or brake light in which layer 716 is red in color.

The controller 740 may control the elements 734 to gradually illuminate when forming the script pattern. That is, the elements 734 may gradually be changed from opaque to transparent in the sequence to allow a visually pleasing display to be formed.

Figure 7C:
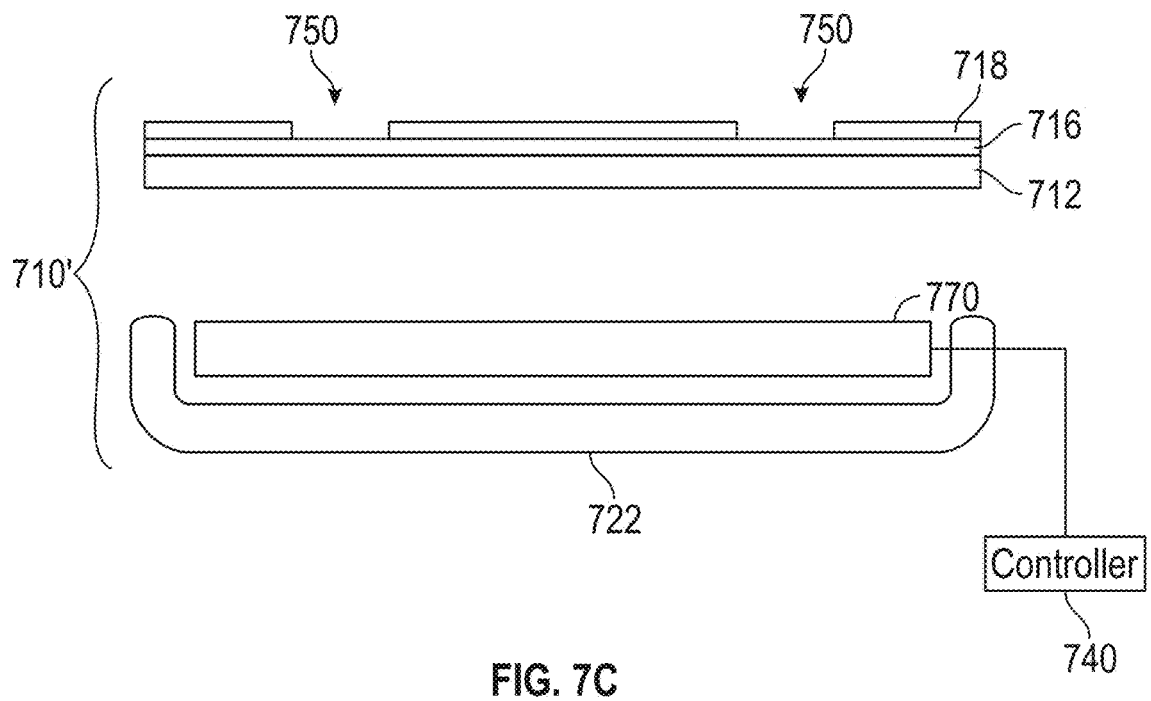
FIG. 7C is a partially exploded view of an alternate display 710 having a pixelated backlight.

Referring now to FIG. 7C, a modification to the display 710 is illustrated as display 710'. In this example, the backlight 730 and the shutter device 732 have been removed and replaced by a pixelated backlight 770. The pixelated backlight 770 may have a plurality of elements 772 that are controlled by the controller 740 in a similar manner to that described above. However, in this example, each element 772 may be turned on or off or be illuminated in between to allow the display to display according to a particular design.

Figure 7D:
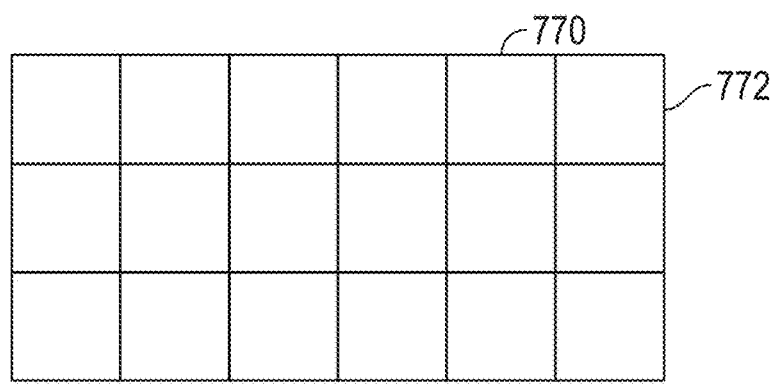
FIG. 7D is an enlarged view of the pixelated backlight.

In operation, FIGS. 7C and 7D have the elements 772 individually controlled to form the desired display or the effect desired. The control may be controlled in a similar manner to that described above in FIGS. 7A-7B in that motion or script can be controlled. The elements 772 may be of different pitches to allow the resolution of the display to be changed. A matrix driver may be disposed within the controller to individually control the various elements.

Figure 8:
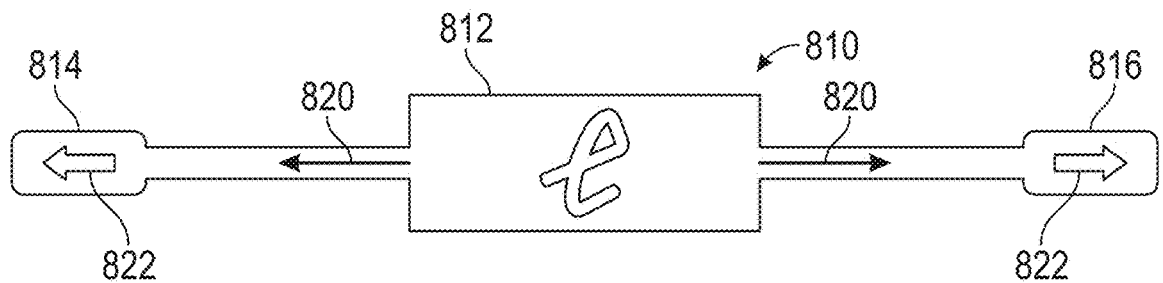
FIG. 8 is a front view of a display corresponding to a logo and turn signal indicators.

Referring now to FIG. 8A, one example of a multi-portion display 810 is set forth. In this example, the first portion 812 is a central logo that may be positioned on a grille or rear portion of a vehicle. A first side portion 814 and a second side portion 816, in this example, are turn signal indicators. The first portion 812 may be continually illuminated. When the turn signal indicator is illuminated, LEDs may be sequentially illuminated along the arrows 820 depending on which direction has been selected. Sequential illumination may extend from the first portion 812 to either the second portion 814 or the third portion 816. Arrows 822 are optional features that may or may not be used depending on the desired design considerations.

Figure 9:
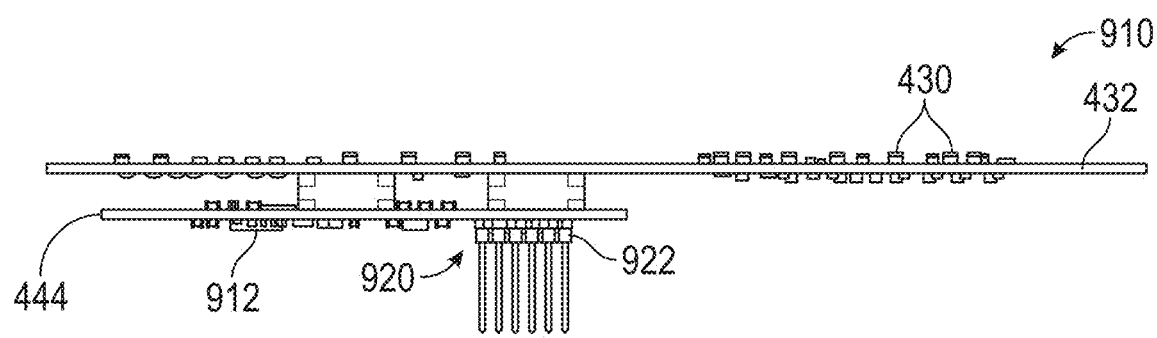
FIG. 9 is a perspective view of the circuit board having an alternate connector.

Referring now to FIG. 9, a circuit board assembly 910 is illustrated. The circuit board assembly 910 has the light sources 430 disposed thereon and the light sources 430 with radial light emitting constructs are on the top of the circuit board 432 with piece-wise addressability control optics. The optic may have heat sinking capability. The electronics controller 912 on the second circuit board 444 addresses radially emitting constructs based on mathematical profiles such as gaussians, step functions, piece-wise time stepped function etc. Emission modulation of these radially emitting elements is accessed based on different intensities that define segment intensity levels that enable total output intensity levels from the addressable illuminated graphic.

Referring now to FIG. 10, a method of controlling light output of a multi-segment display such as that illustrated in FIGS. 4A-4U is set forth. In this example, the variations set forth in FIGS. 4A-4U may be implemented. However, the general features are set forth. In step 1010, a scale factor for each segment is determined at the controller 404. The scale factor may be determined experimentally and form the scale factor table 408 in the memory 406 that is used to scale the light output of each segment provides the same brightness. Providing a uniform display is important in many designs. Therefore, providing uniform brightness at all of the segments is aesthetically pleasing. The determination of uniform brightness may be performed using the histogram illustrated in FIG. 10B. A minimum brightness line 1011 is determined from the segment with the lowest output. In this example, segment number 16 has the lowest output as indicated by the line 1011. The light output of the other segments is illustrated and therefore must be reduced to prevent the segment from being greater than the brightness of the minimum segment. The table 408 is formed to provide a scale factor for each of the segments. The segment size and position may vary and therefore the amount of light output per segment may vary as well. Prior to a final design, the scale factor for each segment may be determined and the current or pulse width duty cycle may be reduced to allow the light output of the segment to remain at the line 1011.

Figure 10A:
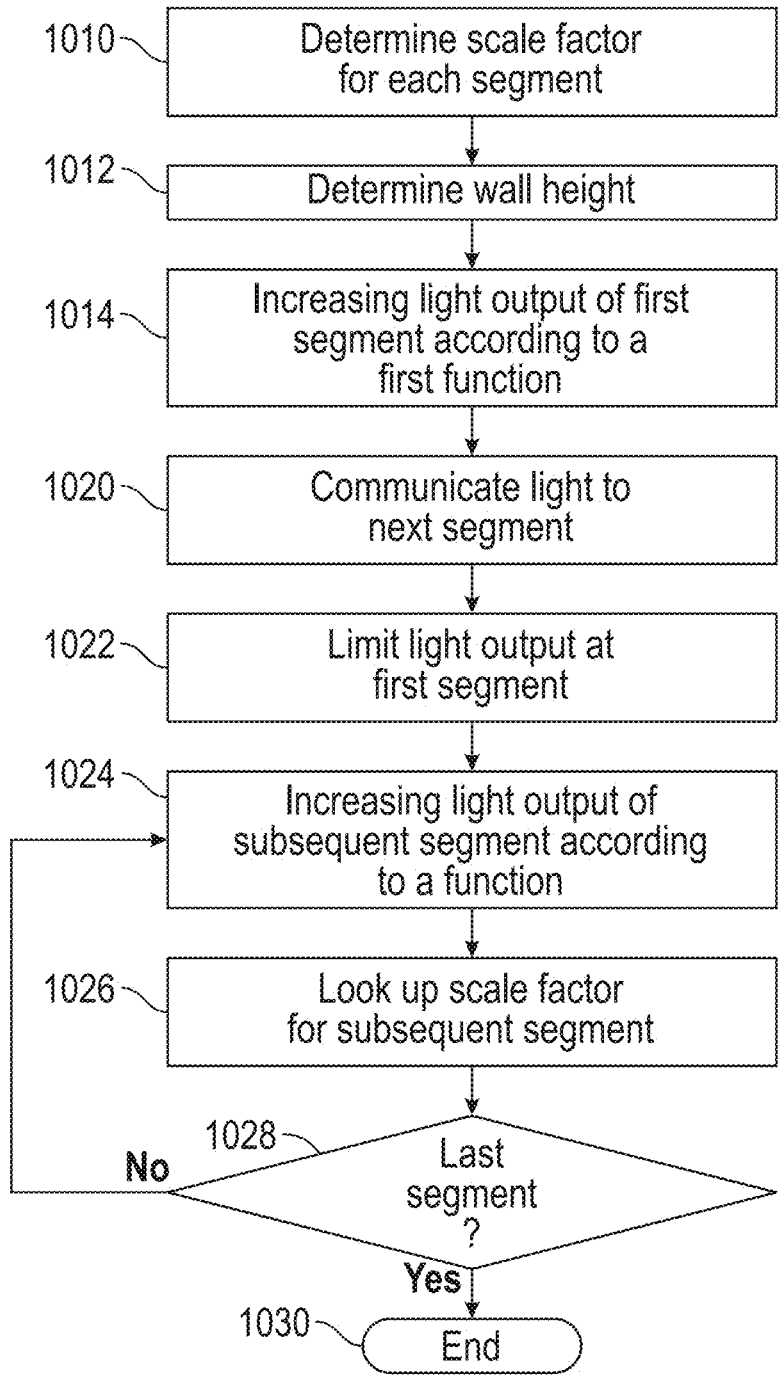
FIG. 10A is a method for operating a multi-segment system.
Figure 10B:
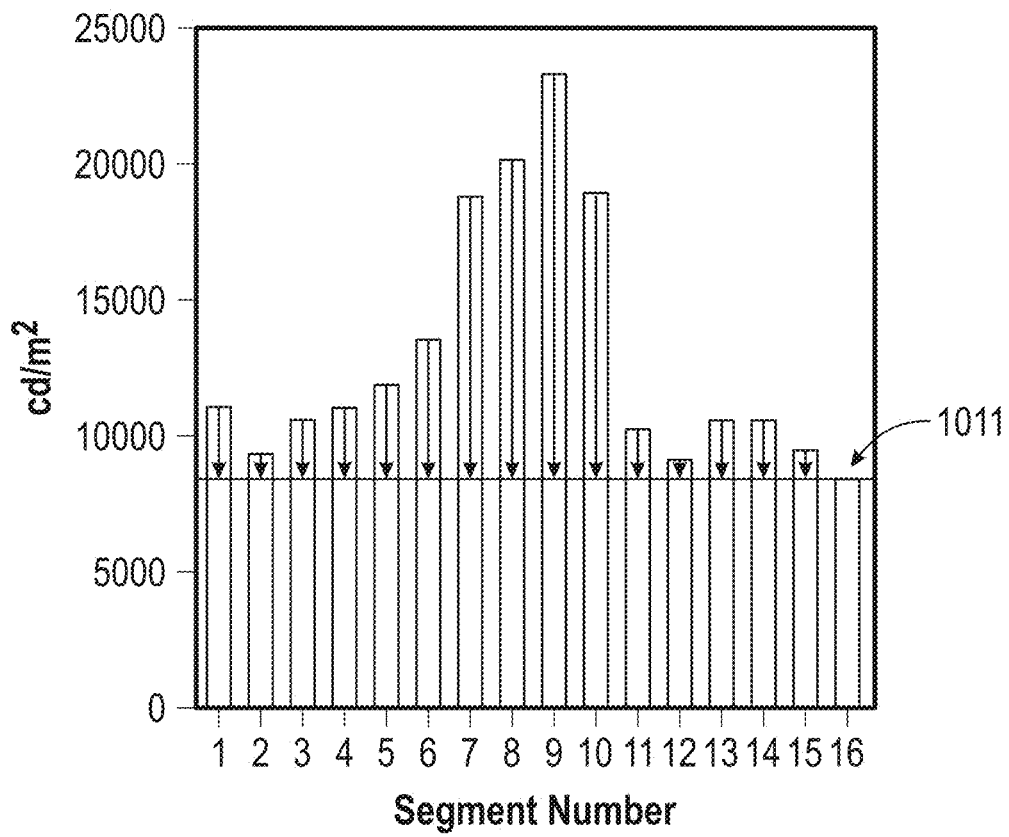
FIG. 10B is a histogram of segments illustrating how a scale factor is derived.
Figure 10C:
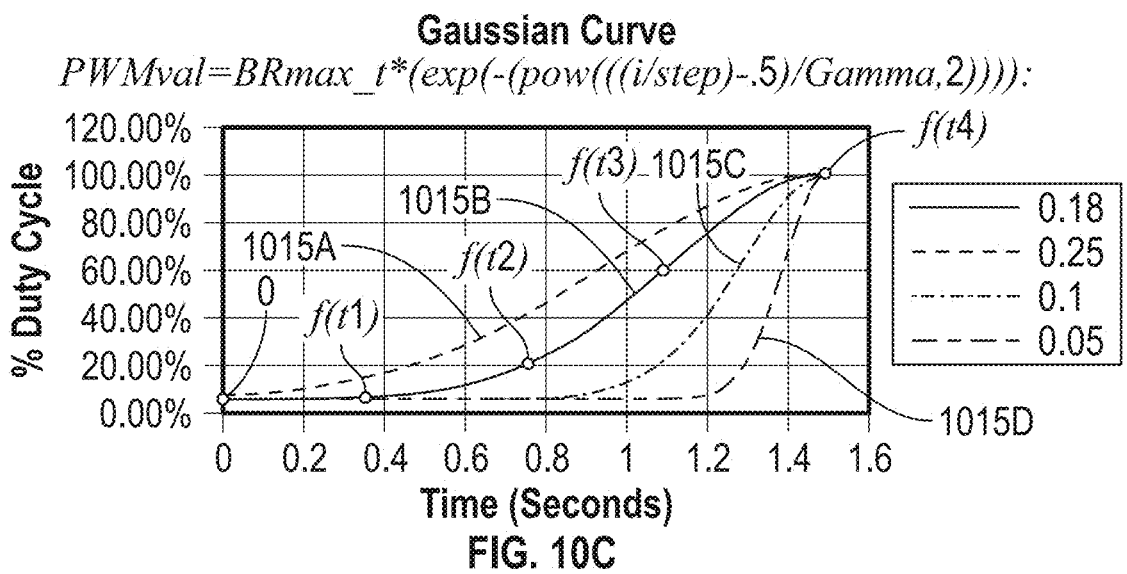
FIG. 10C is a plot of different functions.
Figure 10D:
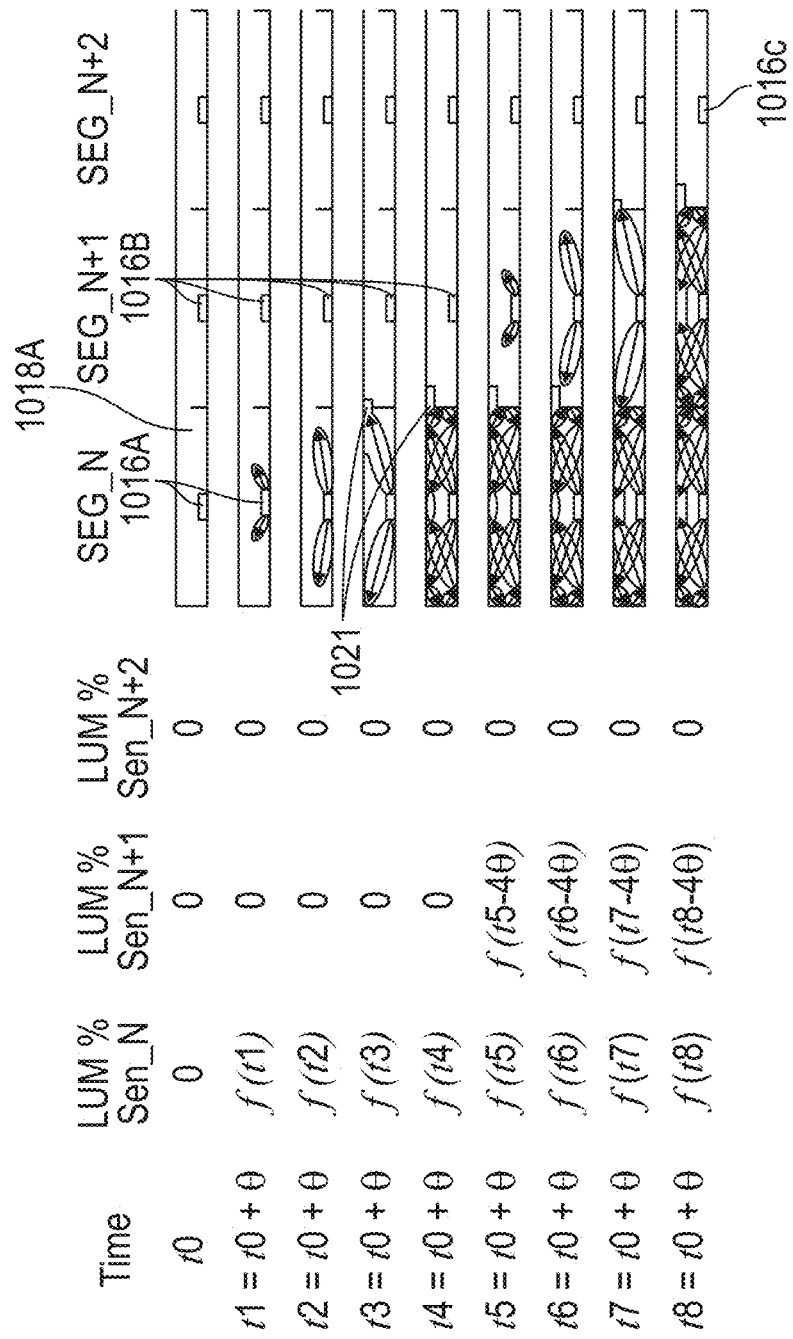
FIG. 10D is a chart illustrating the illumination of sequential segments.

In step 1012, the wall height H, such as that illustrated in FIG. 4D, may be determined. The higher the wall height, the less leakage from one segment to adjacent segments is performed. However, a lower wall height allows more leakage to occur. Designers may experiment with the height of the wall to allow a smooth transition. This is especially important where a continuous sequential illumination is to be provided. It may be desirable to not have a wall height H to the top of the display because a dark spot may result as the illumination is occurring. It has been found that some leakage between segments is desirable. In step 1014, the light output of the first assembly according to a first function may be performed. In some examples, the light output may transition from off (zero) to 100%. However, it has been found that following another function, such as a gaussian function, illustrated in FIG. 10C may be performed. In FIG. 10C, four examples of a gaussian functions are set forth. As noted, the curves for each of the gaussian functions 1015A-1015D provide different outputs between zero and 100% duty cycle. The curve 1015B and the times thereof will be described in greater detail in FIG. 10D. In FIG. 10D, the first segment is illustrated as SEG_N. The various times T1, T2, T3 and T4 are set forth. At time T0, the light source such as LED 1016A, in a first segment 1018A, is in the off state. The LEDs may be various types of light sources including OLEDs. Light starts to emanate from the LED 1016A at time T1 and increases at time T2 and T3. At time T3, light begins to travel through the gap 1021 and at time T4, more light enters the second segment SEG_N+1. At time T5, light continues to enter the second segment SEG_N+1 while the second LED 1016B begins illuminating.

Referring back to FIG. 10A, the light being communicated in step 1020 to the second segment is performed. In step 1022, the light from the first LED 1016 may be limited as mentioned above by a scale factor that limits the current or the duty cycle. In step 1024, the light output increases at the second or subsequent LED according to a function. The function may be the same function or a different function as that used in the first segment. At times T6, T7 and T8, the light eventually begins to leak into the third segment SEG_N+2 at times T7 and T8. After time T8 the third LED 1016C is controlled. The full light output may be achieved at time T8 but may be scaled according to the scale factor in step 1026. The process repeats until the last segment 1028. When the last segment is not reached, steps 1024 and 1026 are repeated. When the last segment has been reached, the process ends in step 1030.

Figures 10E, 10F:
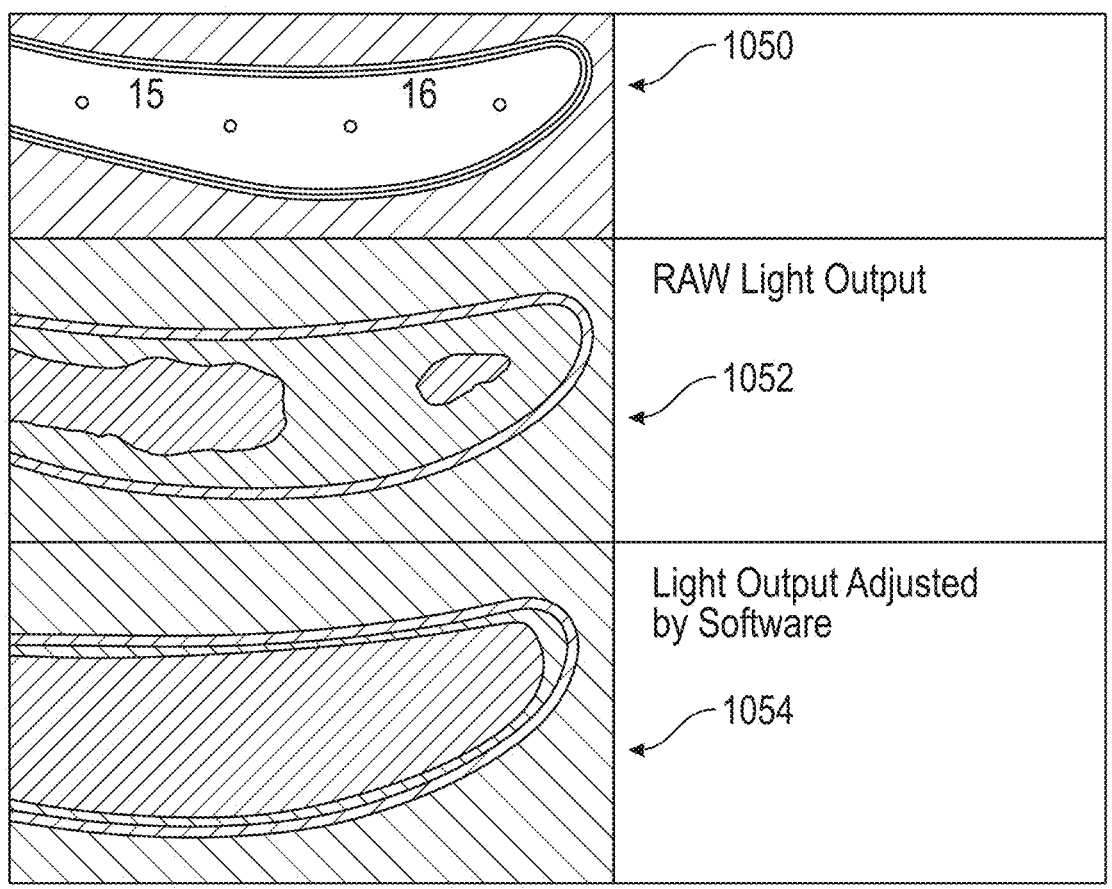
FIG. 10E is a chart showing the amount of leakage to various segments.
FIG. 10F are plots of light output raw and adjusted by software.

Referring now to FIG. 10E, the chart sets forth the leakage for different segments. Segment 1 generates a certain amount of light output which transmits to segment 2 and segment 3. The light output of segment 2 transmits back to segment 1 and segment 3 and so on.

Referring now to FIG. 10F, a plot of the light output is illustrated at 1050. The raw light output is illustrated at 1052 and the light output at 1054 illustrates a more uniform light output that is corrected by the scale factor from the table.

In one example, a connector 920 has a connector shroud 922 molded so the connection system is sealed. In one example, the sealed assembly may use a Gortex® patch to prevent water condensation inside the display assembly. In one example, the design uses laser welding technology to seal housing. Vibration welding is also a viable solution.

Figure 11A:
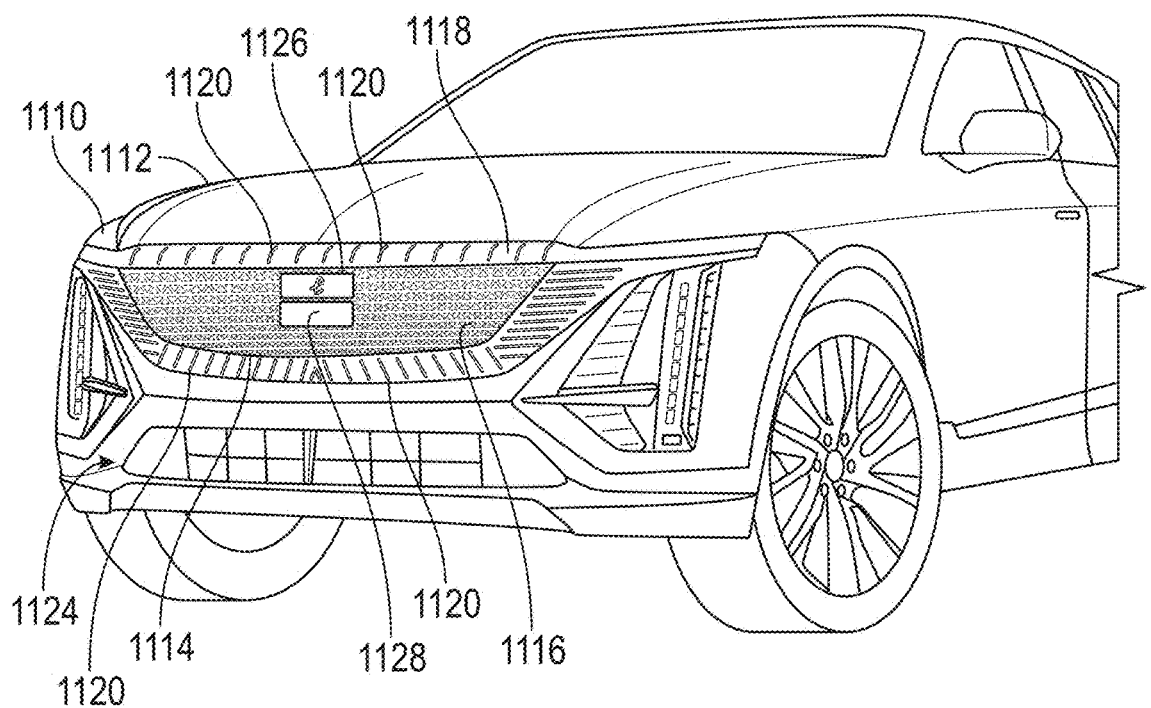
FIG. 11A is a perspective view of a front of vehicle having a front fascia.
Figure 11B:
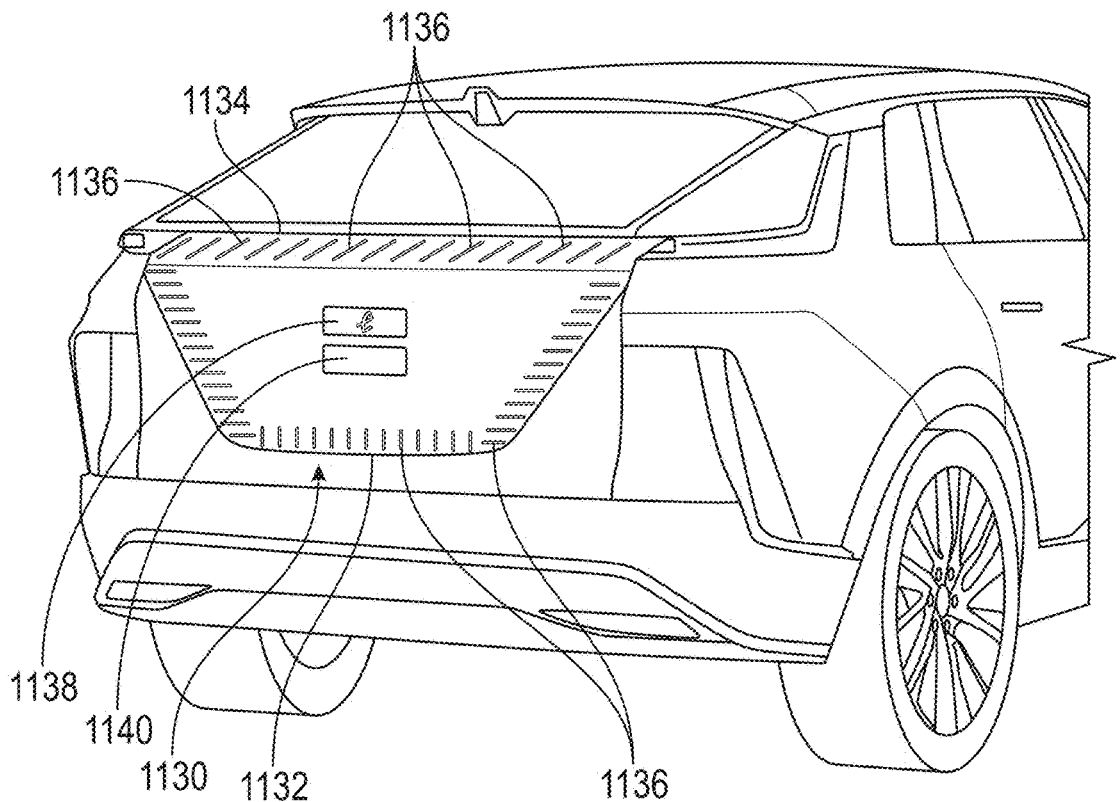
FIG. 11B is a perspective view of a rear of vehicle having a rear fascia.

Referring now to FIG. 11A, a front perspective view of a vehicle 1110 is illustrated. In this example, the vehicle 1110 includes a door 1112 which may be used to cover an engine compartment or a front trunk (frunk). The vehicle 1110 has a display 1114 that includes a first portion 1116 and a second portion 1118. The first portion 1116 includes a plurality of display elements 1120. The display elements 1120 are illuminated elements and are constructed as elongated narrow elements in the present example. The display elements 1120 may each be formed of a single channel with a single light source in each channel. However, segmented channels like those in FIGS. 4A-4U may also be used. However, various styles, shapes, areas and colors of the elements 1120 may be implemented. As well, the sequence and timing within each segment of each element 1120 may be controlled to achieve the desired visual and optical effect.

The first portion 1116, in this example, has a logo portion 1126 disposed therein. The logo portion 1126 may be formed by one of the methods illustrated above. However, rather than being a standalone element, the logo 1116 may be incorporated into the larger structures such as the front fascia 1124 of the vehicle 1110. The first portion 1116 is a forward facing portion of the front fascia 1124. An upward facing portion or second portion 1118 faces upward. Front and upward directions are relative to the vehicle 1110.

Referring now to FIG. 1B, a rear fascia 1130 having a first portion 1132 and a second portion 1134 is set forth. In this example, the first portion 1132 and the second portion 1134 may have elements 1136 disposed thereon. The elements 1136 disposed on the second portion 1134 may face in an upward direction. The first portion 1132 may have a logo portion 1138 and a sensor portion 1140. The logo portions 1126, 1138 of the front and rear displays may not be identical in that different logos may be displayed. Likewise, the sensor areas 1128 and 1140 may house different types of sensors.

The elements 1136 may be arranged and shaped in various geometries as mentioned above relative to the elements 1120. The elements 1120, 1136 may be sequentially controlled and/or color controlled in various sequences and colors to indicate various functions and/or aesthetics.

Figure 11C:
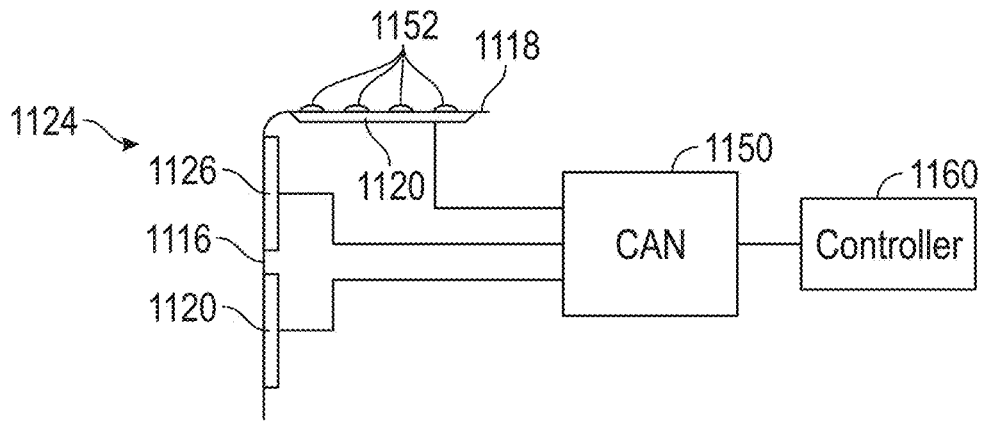
FIG. 11C is a cross-sectional view of a perspective view of the fascia.

Referring now also to FIG. 11C, a cross-sectional view of the front fascia 1124 is illustrated. However, those skilled in the art will recognize the rear fascia 1130 may be configured in a similar manner. The display elements or logo portion 1120, 1126, 1134, and 1138 may all be controlled by a controller area network 1150. The controller area network 1150 may be part of the vehicle and interact with various components of the vehicle 1110. Ultimately, the controller area network 1150 may generate control signals to control the operation of each of the elements 1120 and the displays 1126 and 1138. The controller area network 1150 may generate signals so that the individual light sources within the individual elements may be controlled as mentioned in detail above.

In this example, the elements 1120 on the second portion 1118 may have optical elements 1152 that are used to disperse the light from the elements 1120 in the second portion 1118. The elements 1120, 1136 may be part of the welcome sequence when a user is approaching the vehicle, when the vehicle is charging and used as an indicator of charging or full, or used as a warning such as brake indicator or a collision warning. In front of the vehicle, the element 1120 may be used as a collision warning that is visible by the vehicle operator when looking forward and over the door 1112. The optical elements 1152 direct light in various directions including rearward toward the vehicle operator in a driving position.

Figure 11D:
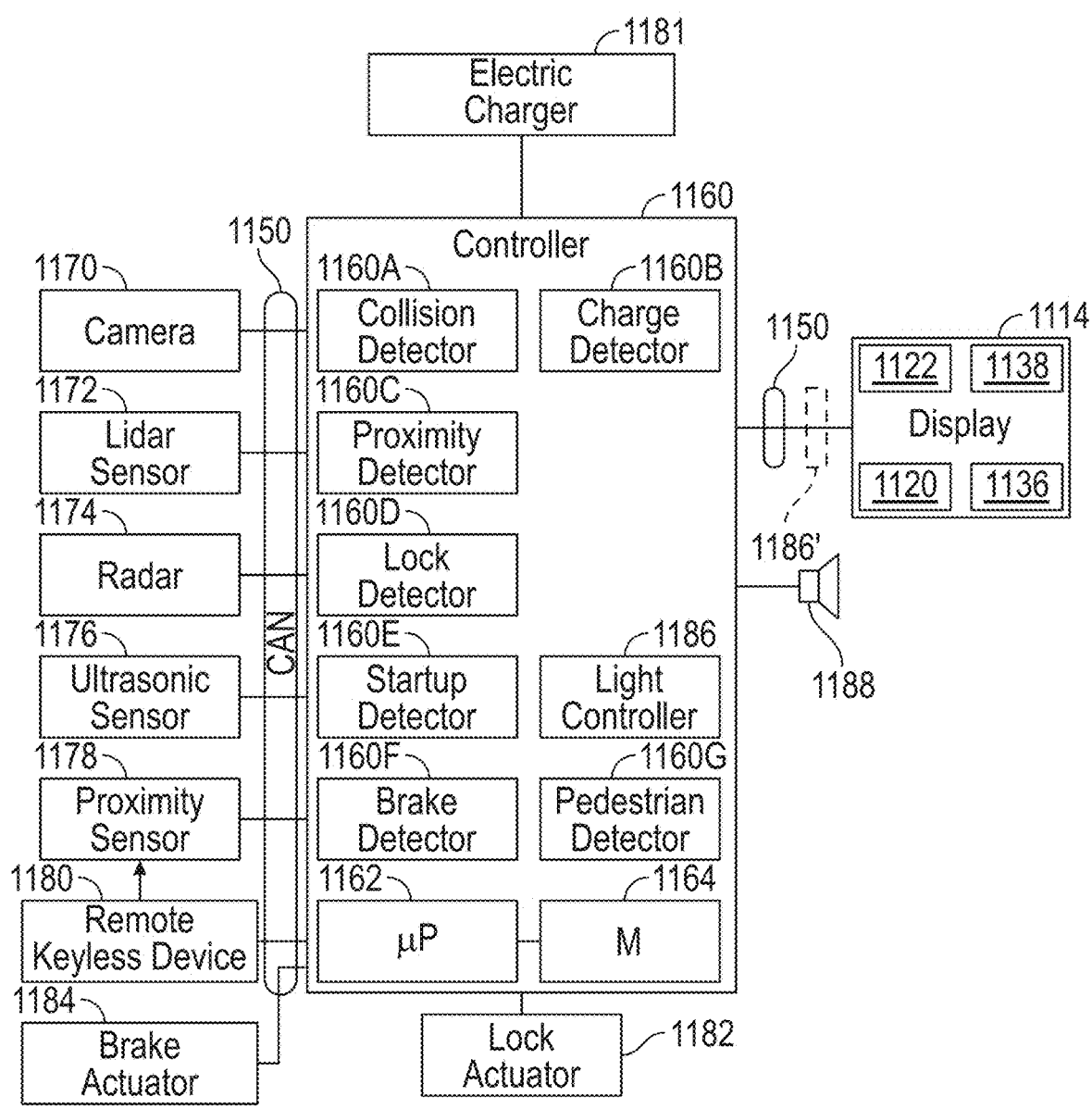
FIG. 11D is a block diagrammatic view of a first example of a system for controlling the fascia.

Referring now also to FIG. 11D, a controller 1160 that may be part of the vehicle control system 1110 is coupled to the controller area network 1150 as illustrated. The controller 1160 may have a microprocessor 1162 coupled to a memory 1164. The memory 1164 is a non-transitory computer-readable medium including machine-readable instructions that are executable by the processor 1162 to perform various functions. The various functions will be described in greater detail below. The controller 1160 has a plurality of circuits that generate a detection signal used to ultimately generate a control signal. The circuits may include a collision detector circuit 1160A that uses condition signals from one or more sensors to detect that the vehicle may be in an impending collision. The collision detector circuit 1160A may also determine the relative distance to a parked vehicle when entering or leaving a parking spot. A proximity sensor 1170A generates a condition signal corresponding to the proximity of a remote keyless 1180 relative to the vehicle. The remote keyless device 1180 may be a handheld key or a phone as a key device. The condition signal corresponds to the remote keyless device 1180 being within a certain range of the vehicle. In response to the remote keyless device condition signal, a startup sequence may be performed at the display.

The controller 1160 may also have charge detector 1160B that is coupled to an electric charger 1181 and generate a condition signal corresponding to being coupled to (or not coupled to) to a battery charger 1181.

A lock detector 1160D may be coupled to a lock actuator 1182 and is used for detecting whether the doors are locked and unlocked by generating a locked or unlocked condition signal.

A startup detector 1160E detects whether the vehicle is being started and generates a startup condition signal.

A brake detector 1160F is coupled to a brake actuator 1184 to detect whether the brakes are being actuated. A condition signal generated by the brake detector indicated whether or not the brakes are being activated.

Each of the detector circuits 1160A-1160F generate detection signals from the condition signals that are used by a light controller 1186 to generate control signals control the display 1114 and the elements thereof.

In one example, the collision detector 1160A may control the elements 1120 on the second portion 1118 to illuminate to make the driver aware that a collision is impending. It is common for a collision warning system to operate a speaker 1188 and generate a visual warning that is projected on the windshield. In this example, the collision detector 1160A illuminates the elements 1120 and together with the optical elements 1152 allows the driver to visually receive a warning of an impending collision. That is, the collision detector 1160A generates a collision signal that is communicated to the light controller 1186 and using the control area network controls one or more elements of the display 1114.

The charge detector 1160B generates a charge detection signal that generates a charge control signal that is communicated to the light controller to control one or more of the elements 1120-1136 based upon the vehicle being connected and charging. The charge detector 1160B may generate a charging signal or a charging complete signal that indicates that the battery is full. A different type of display such as the elements illuminating faster or slower or at a different color may be performed. Both front elements 1120 and/or the rear elements 1136 may be controlled in the same or a different manner.

The proximity detector 1160C may generate a proximity detection signal that corresponds to the distance of the remote keyless device 1180. Based upon the proximity signal, the light controller 1186 may generate a light sequence to welcome a vehicle operator to the vehicle. The operating sequence may be a sequential illumination of the front elements 1120 or the rear elements 1136.

The startup detector 1160E generates a startup detection signal that corresponds to when the vehicle is started. The detection of a key in a tumbler or the pressing of a button in a keyless ignition system may be detected and communicated to the light controller 1186. The light controller 1186 may generate a series or sequence of light controls when the startup detector generates a startup signal. The brake detector 1160F may generate a brake signal that corresponds to the brake pedal being activated. The brake signal is communicated to the light controller 1186 that may generate a redundant display by controlling one of the elements 1136. That is, one or more elements 1136 may generate a brake signal indicator. A pedestrian detector 1160G may also determine whether a collision is impending with a pedestrian based on one or more of the sensors such as the camera 1170, lidar 1172, radar, 1174 or the ultrasonic sensor 1176 or combinations thereof.

Figure 11E:
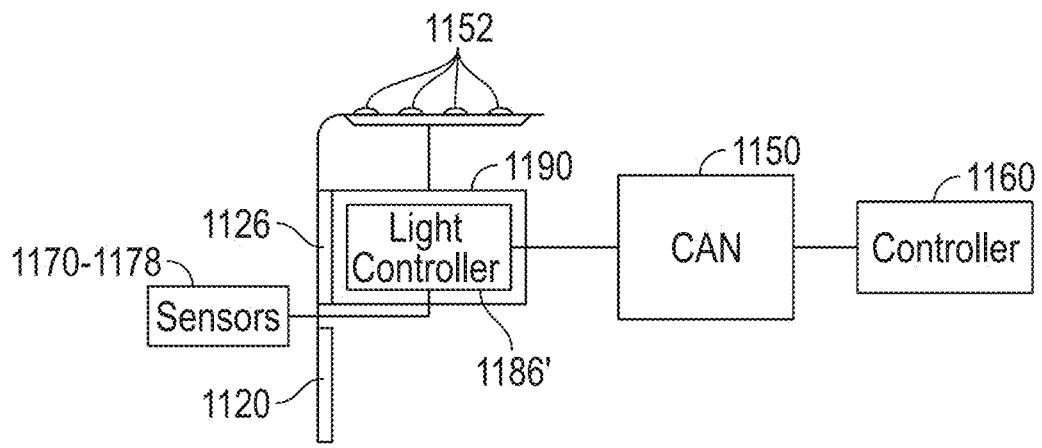
FIG. 11E is a block diagrammatic view of a second example of a system for controlling the fascia.

Referring now to FIGS. 11D and 11E, an alternate configuration to that illustrated above with respect to FIG. 11C is set forth. In this example, the light controller 1186' may be disposed in a pocket 1190 as part of the display 1114. The pocket 1190 may be adjacent to the logo display 1126 such as behind or to the side thereof. Controller 1186' may perform the same functions as light controller 1186 and additional functions. However, in this example, the controller area network 1150 communicates a detection signal corresponding to the detection of a condition through the controller area network 1150 from the controller 1160. In this manner the controller 1186' is a control node controlled by the controller 1160 through the CAN 1150 The light controller 1186' operates the logo display 1126 or the light elements 1120 in a sequence or pattern to obtain the desired effect based on a detection signal received through the CAN 1150.

The sensors 1170-1178 may communicate sensor signals directly to the controller 1186' rather than through the CAN 1150 as illustrated in FIG. 11D. A decision may be made as to whether to pass the sensor signals to the CAN 1150. That is, the light controller 1186' may determine whether the sensor signal is for a local function or a network function. In other words, the light controller 1186' may form a subnetwork with the CAN acting as the main network. That is, should a sensor signal be used to activate or control one of the elements 1120 and that is the only function needed for that sensor signal, the controller 1186' does not need to pass the signal to the CAN 1150.

Figure 11F:
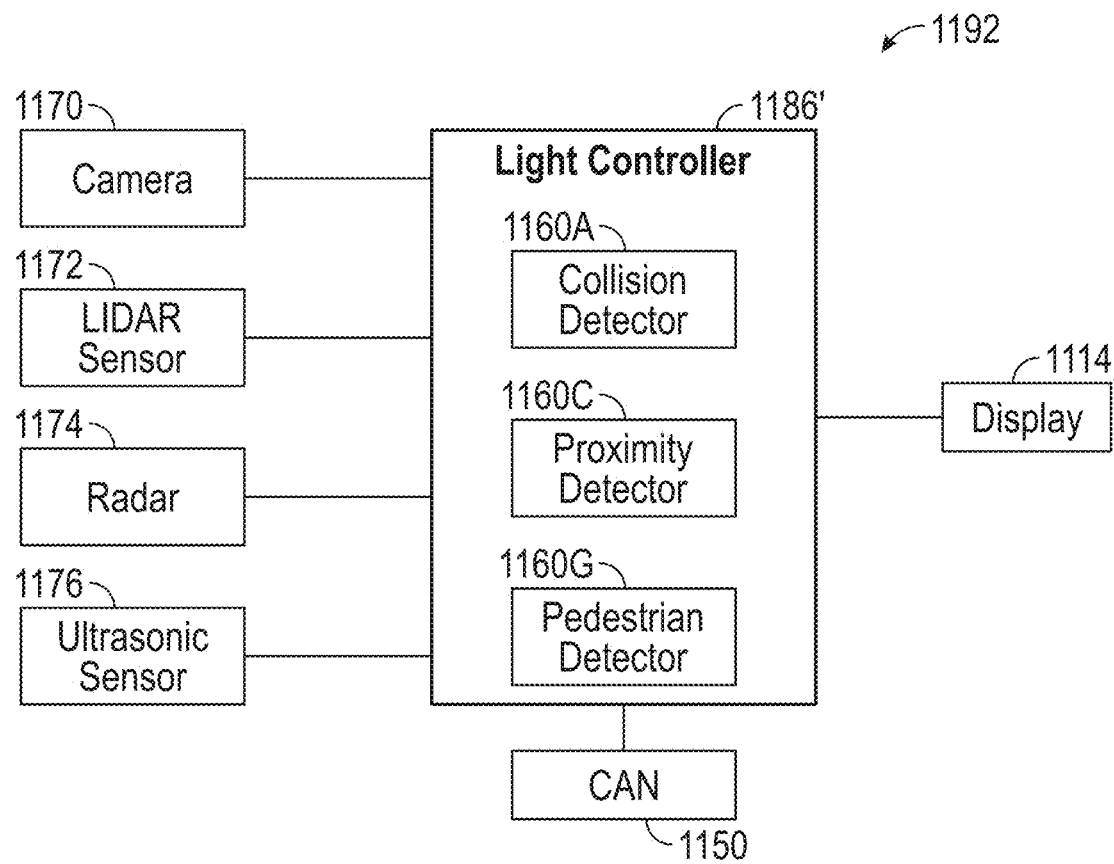
FIG. 11F is a block diagrammatic view of a simplified subnetwork.

In FIG. 11F, the light controller 1186' may include some of all of the detector circuits 1160A and 1160F. In this example, the collision detector 1160A, a proximity detector 1160C and the pedestrian detector 1160G are illustrated in the light controller 1186' forming the sub-network 1192. In this example, when the function, such as generating a warning display using the elements 1120 is to be performed, the light controller 1186' can choose to perform the sub-network function without communicating the signal through the CAN 1150 to reduce the control burden within the CAN 1150. A warning to a p Referring now to FIG. 12A, a method for operating the display is set forth. In step 1210, a condition signal is generated at one of the sensors which includes the camera 1170, a lidar sensor 1172, the radar 1174, the ultrasonic sensor 1176, the proximity sensor 1178, the lock actuator 1182 and the brake actuator 1184.

In step 1212, the condition signal is communicated to the controller 1160 through the controller area network 1150. In particular, the various detector circuits 1160A-1160F are used to generate detection signals corresponding to a detection based on the condition signals. In step 1214, the detection signals are communicated to the light controller 1186. The light controller 1186, in step 1216, generates a control signal that is communicated through the controller area network to control the elements 1120, 1136 and even the logo areas 1126 and 1138. That is, in step 1218, the elements of the display are controlled according to the control signal.

Figure 12A:
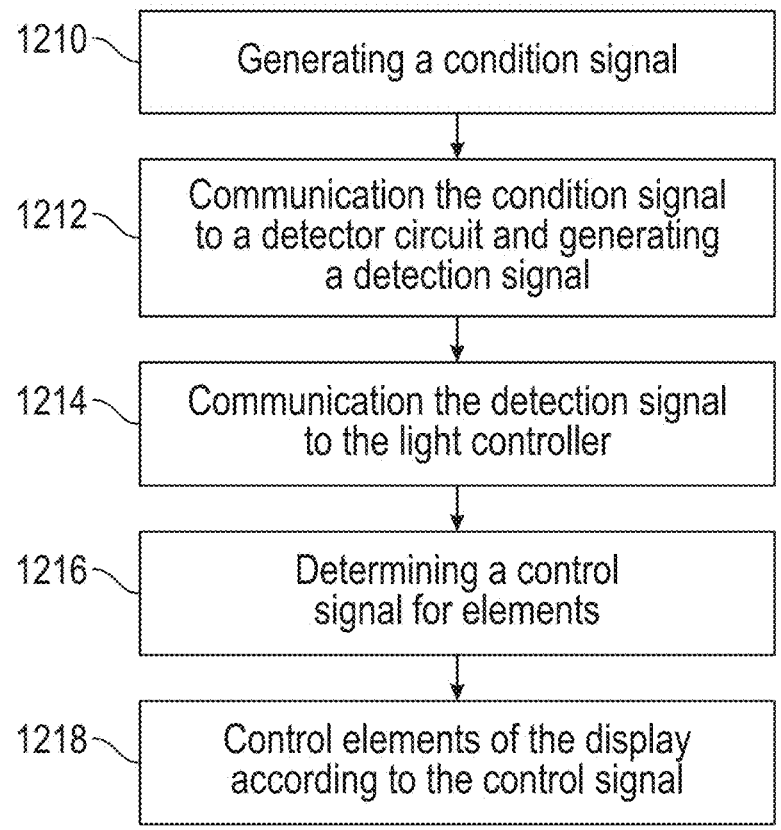
FIG. 12A is a flowchart of a first method for operating the system of FIG. 11D.
Figure 12B:
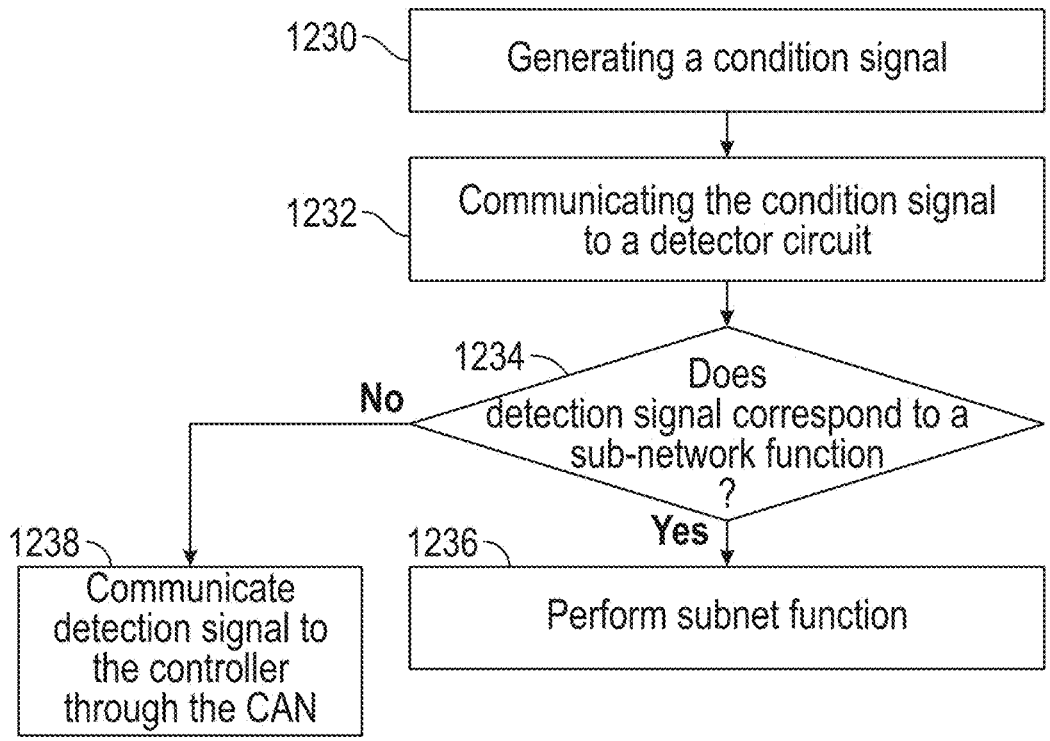
FIG. 12B is a flowchart of a second method for operating the system of FIG. 12A.

Referring now to FIG. 12B, a second method for operating the display is set forth that corresponds to FIG. 11F. In step 1230, a condition signal is generated at one of the sensors which includes the camera 1170, a lidar sensor 1172, the radar 1174, the ultrasonic sensor 1176, the proximity sensor 1178, the lock actuator 1182 and the brake actuator 1184.

In step 1232, the condition signal is communicated to the controller 1186' In particular, the various detector circuits 1160A-1160F may be within or associated with the light controller 1186' are used to generate detection signals corresponding to a detection based on the condition signals.

In step 1234, the detection signals are used to determine whether the functions correspond to a sub-network function. In step 1238, when the detection signal or signals correspond exclusively to a sub-network function in step 1234, the function is performed in the sub-network by generating a control signal and the detection signal is not communicated to the controller 1160 through the CAN 1150. That is, in step 1238, the elements of the display 1114 are controlled according to a control signal.

In step 1238, the detection signals are communicated to the controller 1260 through the controller area network 1150 to perform various functions or make certain determinations in the vehicle when the detection signals are not exclusive to the sub-network.

Figure 13:
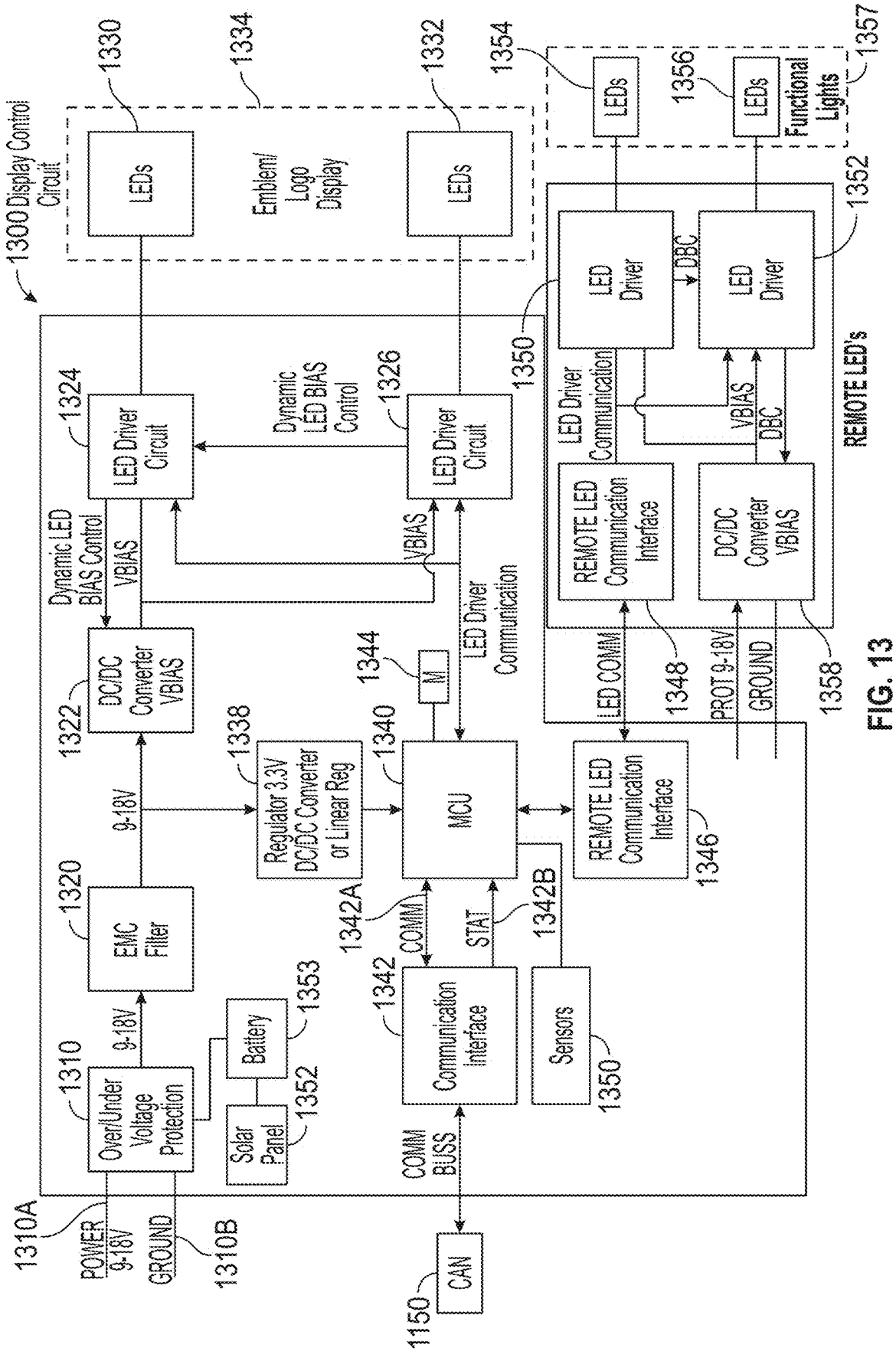
FIG. 13 is a diagrammatic view of a display control circuit with a sub-network.

Referring now to FIG. 13, an example of a display control circuit for driving the display is set forth. In this example, a voltage protection circuit 1310 receives power and ground from elsewhere in the vehicle through a power terminal 1310A and a ground terminal 1310B. The protection circuit 1310 provides both over voltage and under voltage protection. That is, the protection circuit 1310 protects the voltage to the display control circuit 1300 from operating an above maximum circuit operating condition and below a negative voltage condition.

The output of the voltage protection circuit 1310 is a voltage signal that is provided to an electromagnetic capability (EMC) filter circuit 1320. The EMC filter circuit 1320 prevents conducted noise from exiting through the power terminal 1310A and the ground terminal 1310B. The filtered voltage signal from the EMC filter circuit 1310 is provided to a DC/DC converter 1322. The DC/DC converter 1322 generates a VBIAS signal that is provided to a first LED driver circuit 1324 and a second LED driver circuit 1326. The VBIAS signal is a dynamic LED bias control signal that is communicated to both of the LED driver circuits 1324, 1326 to ensure all LEDs, such as the LEDs 1330 coupled to the LED driver circuit 1324 and the LEDs 1332 coupled to the LED driver circuit 1326, have the correct voltage.

The LED driver circuit 1326 generates a dynamic LED bias control signal that is communicated to the LED driver circuit 1324. The LED driver circuit 1324, in turn, communicates a dynamic LED bias control signal to the DC/DC converter 1322. The bias control signal is used to adjust the LED voltage VBIAS to minimize the power consumption and heat generated by the LED driver circuits 1324, 1326 and the LEDs 1330, 1332. The LEDs 1330, 1332 may be part of the emblem or logo display 1334cv illustrated above.

The EMC filter 1320 also provides the filter voltage to a regulator such as a voltage control circuit 1338 such as a DC/DC converter or a linear regulator. The regulator 1338 provides regulated voltage, such as 3.3 volts, in this example, so that the microcontroller 1342 has a stable proper voltage for operation. A high current application for the circuit 1338 is chosen to allow the microcontroller 1340 to run for a period of time after the power is removed to perform housekeeping functions such as EEPROM emulator using FLASH.

A communication interface 1342 communicates with the communication area network 1150 illustrated above. The communication area network 1150 provides and receives signals from the communication interface 1342. Communication signals 1342A are provided to and from the microcontroller 1340. Status signals 1342B are provided from the communication interface to the microcontroller 1340. The microcontroller 1340 has a memory 1344 associated therewith. The memory 1344 is a non-transitory computer-readable medium including machine-readable instructions that are executable by the processor. The machine-readable instructions include instructions for operating the LEDs 1330 and 1332 in a way desirable by the vehicle designers. The microcontroller 1340 is in communication with a first remote LED communication interface 1346.

It should be noted that although the CAN 1150 is illustrated, various types of communications methods or systems, such as FD-CAN, UART, I2C, SPI, Ethernet and more ways of communications may be provided.

The first remote LED communication interface 1346 communicates control signals to an LED driver 1350 and 1352. The communication interface 1346 allows the sequencing and operation of the LEDs 1354, 1356 associated with the respective LED driver circuits 1350, 1352.

A DC/DC converter 1350 generates a DC/DC converter signal (VBIAS) to the LED driver circuits 1350, 1352 so that a regulated voltage is provided to each of the driver circuits 1350, 1352. A dynamic bias control signal (DBC) is communicated from the LED driver 1350 to the LED driver 1352. The LED driver 1352 generates a dynamic bias control signal (DBC) which is communicated to the DC/DC converter 1358. The dynamic bias control signal (DBC) is used by the DC/DC converter 1350 to allow the LED voltage to be adjusted to minimize power consumption and the heat generated by the LEDs 1354, 1356 and the driver circuits 1350, 1352. The voltage for the DC/DC converter 1358 may be provided from the EMC filter 1320.

The microcontroller 1340 may also be coupled to sensors 1350. The sensors 1350 may be one or more of the sensors described above such as the camera sensor 1170, the LIDAR sensor 1172, the radar sensor 1174 and the ultrasonic sensor 1176. As mentioned above, the microcontroller 1340 may control the LED drivers 1324, 1326, 1350 and 1352 to illuminate in a controlled way according to the conditions sensed by the sensors 1350. Control examples are provided above.

As mentioned above, power may be provided from an external source through the power terminal 1310A and the ground terminal 1310B. However, the display control circuit 1300 may also be coupled to a solar panel 1351 and/or a battery 1353. The solar panel 1351 may be used to charge the battery 1353 so that the operation of the LEDs 1330, 1332, 1354 and 1356 may be performed without the external power. The solar panel 1351 may be used to maintain the battery 1353 at a charged level. The output of the battery 1353 and/or the solar panel 1351 may be coupled to the voltage protection circuit 1310 which, in turn, provides filtered power to the rest of the circuit through the EMC filter 1320.

The LEDs 1330 and 1332 may be part of an emblem or logo display 1334. Of course, other functions may be provided for the LEDs 1330, 1332.

The LEDs 1354, 1356 may perform various display functions. One or more of the LEDs 1330, 1332, 1354, 1356 may perform various other types of functions in a vehicle such as turn signals, high beams, low beams, fog lights, marker lights, decorative display lights and other lighting functions.

It should be noted that the sub-network described above may be formed by the controller 1340, the communication interface 1346, the communication interface 1348, the converter 1358 and the LED drivers 1350-1352 as well as the LEDs 1354 and 1356.

Figure 14:
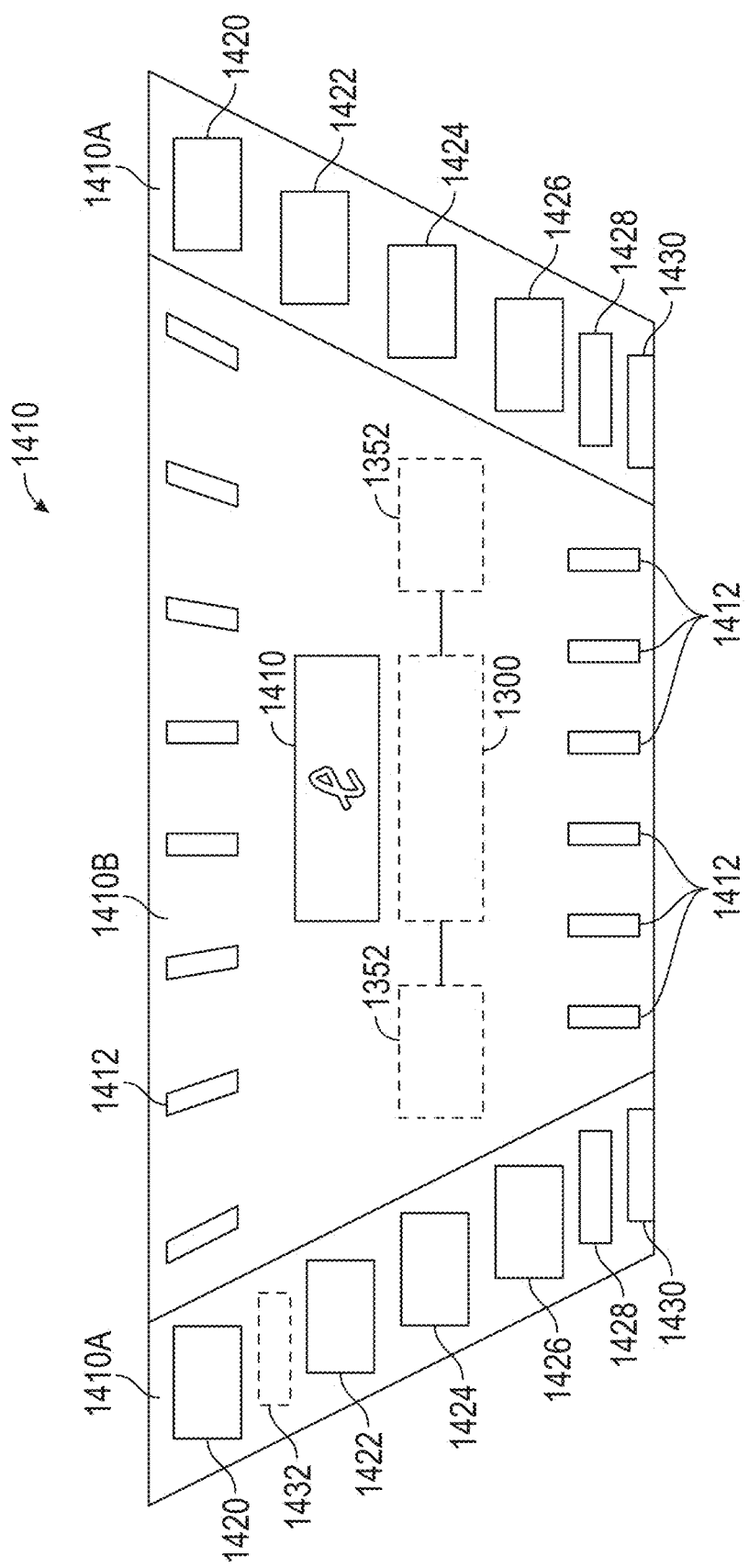
FIG. 14 is an alternate example of a display assembly.

Referring now to FIG. 14, another example of a display 14 is illustrated. The display 1410 may have a functional portions 1410A and aesthetic portions 1410B. The functional portion 1410A and the aesthetic portion 1410B may be integrally formed into the single display 1410. The aesthetic portion 1410B has an emblem or logo display 1410 and light elements 1412. The display control circuit 1300 may be coupled behind the display 14. The display control circuit 1300 may include the sensors 1350 and the other portions of the circuit 1310-1352. The display control circuit 1300 may also include the solar panels 1351. However, the solar panels 1351 are illustrated as separate components in FIG. 14.

The functional portions 14A may have various functional LEDs including high beams 1420, low beams 1422, brake lights 1424, fog lights 1426, marker lights 1428 and turn signals 1430. Although the functional portions 14A are illustrated as completely separate, the various lights 1420-1430 may be incorporated into the aesthetic portion 14B. One or more of the LEDs 1330, 1332, 1354 and 1356 may be used to form the functional elements 1420-1430.

Should the display 1410 be a rear display, the high beams 1420 and the low beams 1422 may be replaced by a brake lights 1432.

It should be noted that FIGS. 12A and 12B may be used to operate the examples set forth in FIG. 13. That is condition signals may be generated at the sensors 1350 and the controller 1340 may act as the light controller that is used for controlling the elements. Likewise, in FIG. 12B, condition signals may be generated from the sensors 1350 and the controller 1340 may determine whether or not to communicate the signals back through the controller area network 1150. The sub-network function described in step 1236 may be performed by controlling the LED drivers and the LEDs within the control circuit 1300 under the control of the controller 1340.

Figure 15:
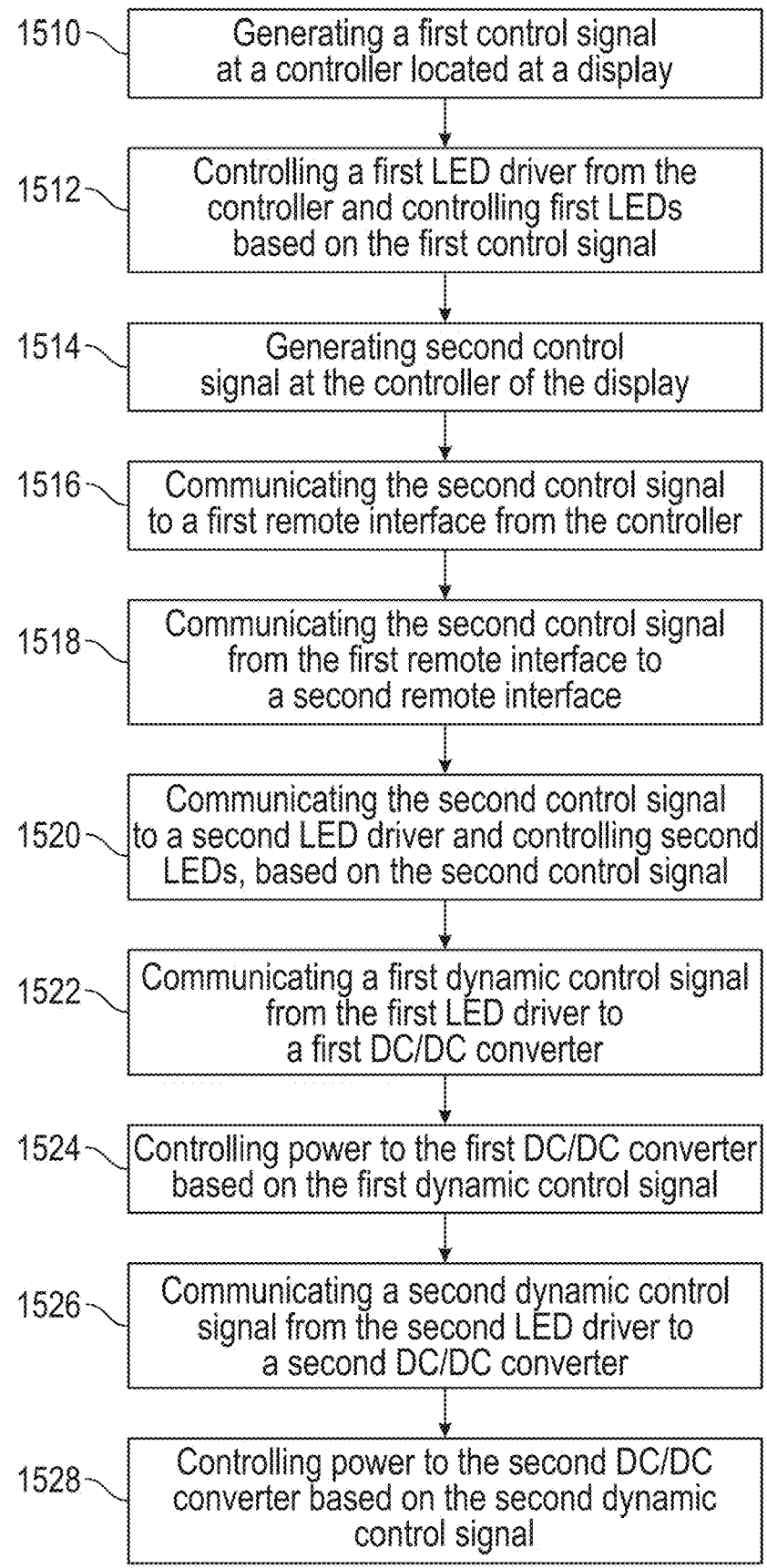
FIG. 15 is a block diagrammatic view of a circuit for controlling a display.

Referring now to FIG. 15, a method of controlling the circuit of FIG. 13 is set forth. In step 1510, a first control signal is generated at the controller 1340 of the display control circuit which is located at the display. As mentioned above, a pocket or other device may be used to secure the control circuit to the display. In step 1512, a first LED driver is controlled from the controller for controlling the first LEDs based on the first control signal.

In step 1514, a second control signal is generated at the controller of the display. The second control signal is communicated to a communication interface near the controller 1340. Ultimately, the first communication interface communicates with a second communication interface that is located near the LEDs and the LED drivers for the second group of LEDs. In step 1520, the second control signals communicated to a second LED driver that controls the second LEDs based on the second control signal. In step 1522, a dynamic control signal is generated at the first LED driver and is communicated to the first DC/DC converter. In step 1524, power is controlled at the DC/DC converter based on the first dynamic control signal. By providing the dynamic biased control signal, the amount of power to the LEDs is controlled to ensure that all of the LEDs have the correct voltage for operation. This is important in a display that uses multiple LEDs because the amount of light output from the LEDs should be consistent throughout the display.

In step 1526, a second dynamic control signal is communicated from the second LED driver to a second DC/DC converted. In step 1528, the power to the second DC/DC converter is controlled based on the second dynamic control signal.

The present system provides a benefit of creating the interaction of the ink and light via a transflective surface. The transflective surface that transmits and reflects light giving both a daytime and nighttime appearance. The ink interacts with light and creates spectral modifications. In one example, the ink may be screen printed. Control is implemented to drive the LEDs to enable the visual interface. In a vehicle setting the visual interface may change. For example, in an electric vehicle plugged into a charger, the visual interface may blink slowly or change color or both while charging. Then, when the battery is charged, the visual appearance may change to a second visual interface. For example, a steady green light may indicate the battery being charged. The use of the daughter board is used for control and strategy to mitigate RF emission. RF emission can take place using EMC filtering on the daughter board. The daughter board is between the LED circuit board and the back side of the housing (away from the direction of illumination). EMC issues may be further reduced by making the back housing from metal or metal particles injected into the plastic. The PB board having the LEDS thereon may be formed of or have a layer of metal. When combined with a metal rear housing, the PCB and the rear housing form a Faraday cage around the controller reducing EM emissions therefrom. This may reduce the requirement for other EM filtering. For the animation, the illumination of the inks via piecewise segmented illuminated elements is controlled and may also be user controllable. The LED driver and the channel architecture are set up along with the Gaussian function to create segment to segment transitions in illumination. There is an optothermal nature of the animation optics with segment-to-segment transitions. When implemented in a vehicle, software enabling direct drive from the vehicle may be used. RGB enhancements via photon recycling channels with a transflective ink structure may be used. FNV4 LRM as a non-FMVSS illumination strategy and 2D free for curve with Photon recycling channels may be used. Interaction of the PWM signal light mixing interactions with the structure to eliminate visual flicker. Uniform luminance in the channels enabling uniform interaction of light with the ink pigments.

The foregoing description of the examples has been provided for purposes of illustration and description. It is not intended to be exhaustive or to limit the invention. Individual elements or features of a particular example are generally not limited to that particular example, but, where applicable, are interchangeable and can be used in a selected example, even if not specifically shown or described. The same may also be varied in many ways. Such variations are not to be regarded as a departure from the invention, and all such modifications are intended to be included within the scope of the invention.

What is claimed is:

1. A display comprising:
   a first housing portion having graphic openings therein;
   a second housing portion spaced apart from the first housing portion, said second housing comprising a side wall with a reflective surface;
   a first circuit board disposed perpendicular to the side wall, said first circuit board comprising a plurality of 360 degree side emitting light emitting diodes having emitting surfaces perpendicular to the first circuit board, said first circuit board disposed between the first housing portion and the second housing; and
   said first housing portion and the second housing portion form a first photon recycling cavity having the plurality of 360 degree side emitting light emitting diodes disposed therein so that light from the plurality of 360 degree side emitting light emitting diodes is indirectly communicated through the graphic opening after reflecting within the photon cavity.

2. The display of claim 1 further comprising a second circuit board electrically coupled to the first circuit board.

3. The display of claim 2 wherein the second circuit board comprises a power supply.

4. The display of claim 3 wherein the power supply comprises a buck power supply.

5. The display of claim 2 wherein the second circuit board is disposed in a pocket formed in the second housing.

6. The display of claim 5 wherein the first circuit board is parallel to the second circuit board within the pocket.

7. The display of claim 1 wherein the plurality of 360 degree side emitting light emitting diodes is misaligned with the graphic openings.

8. The display of claim 1 wherein the plurality of 360 degree side emitting light emitting diodes is aligned with opaque portions between the graphic openings.

9. The display of claim 1 wherein a transreflective ink is disposed on the first housing portion.

10. The display of claim 9 wherein the transreflective ink is between a light source and the graphic opening.

11. The display of claim 9 wherein the transreflective ink is applied to a film and thermoformed to an inner surface of the first housing portion.

12. The display of claim 1 wherein the second housing portion comprises an outer wall having a white surface.

13. The display of claim 12 wherein the white surface is formed from white composite material.

14. A vehicle comprising:
    a grill; and
    the display of claim 1 coupled to the grill.

15. A vehicle comprising:
    a tailgate; and
    the display of claim 1 coupled to the tailgate.

16. A vehicle comprising:
    a bumper or body panel,
    the display of claim 1 coupled to the bumper or body panel.

17. A point of sale display unit comprising:
    a panel; and
    the display of claim 1 coupled to the panel.

18. The point of sale display unit of claim 17 wherein the panel comprises a back panel.

19. The point of sale display unit of claim 17 wherein the panel comprises at least one of a front panel or a side panel.

* * * * *